United States Patent
Inukai et al.

(10) Patent No.: US 7,061,186 B2
(45) Date of Patent: Jun. 13, 2006

(54) EL DISPLAY DEVICE AND ELECTRONIC APPARATUS

(75) Inventors: Kazutaka Inukai, Kanagawa (JP); Jun Koyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 125 days.

(21) Appl. No.: 10/745,153

(22) Filed: Dec. 23, 2003

(65) Prior Publication Data

US 2004/0164684 A1 Aug. 26, 2004

Related U.S. Application Data

(63) Continuation of application No. 09/715,528, filed on Nov. 17, 2000, now Pat. No. 6,680,577.

(30) Foreign Application Priority Data

Nov. 29, 1999 (JP) ............................. 11-338845
Oct. 2, 2000 (JP) ........................ 2000-302979

(51) Int. Cl.
G09G 3/10 (2006.01)
G09G 3/12 (2006.01)

(52) U.S. Cl. ...................................... 315/169.3; 345/45

(58) Field of Classification Search ............. 315/169.1, 315/169.2, 169.3–169; 345/205, 635, 45, 345/48, 76, 92; 313/444, 447, 458, 463
See application file for complete search history.

(56) References Cited

U.S. PATENT DOCUMENTS

| | | | |
|---|---|---|---|
| 4,356,429 A | 10/1982 | Tang | 313/503 |
| 4,539,507 A | 9/1985 | VanSlyke et al. | 313/504 |
| 4,720,432 A | 1/1988 | VanSlyke et al. | 428/457 |
| 4,769,292 A | 9/1988 | Tang et al. | 428/690 |
| 4,885,211 A | 12/1989 | Tang et al. | 428/457 |
| 4,950,950 A | 8/1990 | Perry et al. | 313/504 |
| 5,047,687 A | 9/1991 | VanSlyke | 313/503 |

(Continued)

FOREIGN PATENT DOCUMENTS

| | | |
|---|---|---|
| EP | 717 445 | 6/1996 |
| EP | 776 147 | 5/1997 |
| JP | 62-090260 | 4/1987 |
| JP | 08-078519 | 3/1996 |
| JP | 08-241048 | 9/1996 |
| JP | 09-148066 | 6/1997 |
| JP | 10-189525 | 7/1998 |
| JP | 10-247735 | 9/1998 |

*Primary Examiner*—Don Wong
*Assistant Examiner*—Minh Dieu A
(74) *Attorney, Agent, or Firm*—Cook, Alex, McFarron, Manzo, Cummings & Mehler, Ltd.

(57) ABSTRACT

An EL display device capable of clear, multi-gradation color display, and an electronic device having the EL display device, are provided. Gradation display is performed in accordance with a time division driver method which controls by the amount of time an EL element formed in a pixel emits light, and the amount of time it does not emit light. Influence due to dispersion in the characteristics of electric current TFTs is prevented.

19 Claims, 28 Drawing Sheets

U.S. PATENT DOCUMENTS

| | | | |
|---|---|---|---|
| 5,059,861 A | 10/1991 | Littman et al. | 313/503 |
| 5,059,862 A | 10/1991 | VanSlyke et al. | 313/503 |
| 5,061,617 A | 10/1991 | Maskasky | 430/569 |
| 5,073,446 A | 12/1991 | Scozzafava et al. | 428/323 |
| 5,151,629 A | 9/1992 | VanSlyke | 313/504 |
| 5,294,869 A | 3/1994 | Tang et al. | 313/504 |
| 5,294,870 A | 3/1994 | Tang et al. | 313/504 |
| 5,563,427 A | 10/1996 | Yudasaka et al. | 257/72 |
| 5,641,991 A | 6/1997 | Sakoh | 257/755 |
| 5,814,834 A | 9/1998 | Yamazaki et al. | 257/59 |
| 5,818,067 A | 10/1998 | Rha et al. | 257/57 |
| 5,835,172 A * | 11/1998 | Yeo et al. | 349/46 |
| 5,839,456 A | 11/1998 | Han | 134/104.1 |
| 5,882,761 A | 3/1999 | Kawami et al. | 428/69 |
| 6,140,667 A | 10/2000 | Yamazaki et al. | 257/59 |
| 6,259,138 B1 | 7/2001 | Ohtani et al. | 257/351 |
| 6,274,887 B1 | 8/2001 | Yamazaki et al. | 257/72 |
| 6,365,917 B1 | 4/2002 | Yamazaki | 257/72 |
| 6,380,560 B1 | 4/2002 | Yamazaki et al. | 257/72 |
| 6,420,758 B1 * | 7/2002 | Nakajima | 257/350 |
| 6,489,952 B1 * | 12/2002 | Tanaka et al. | 345/205 |
| 6,680,577 B1 * | 1/2004 | Inukai et al. | 315/169.3 |
| 6,773,971 B1 * | 8/2004 | Zhang et al. | 438/163 |

* cited by examiner

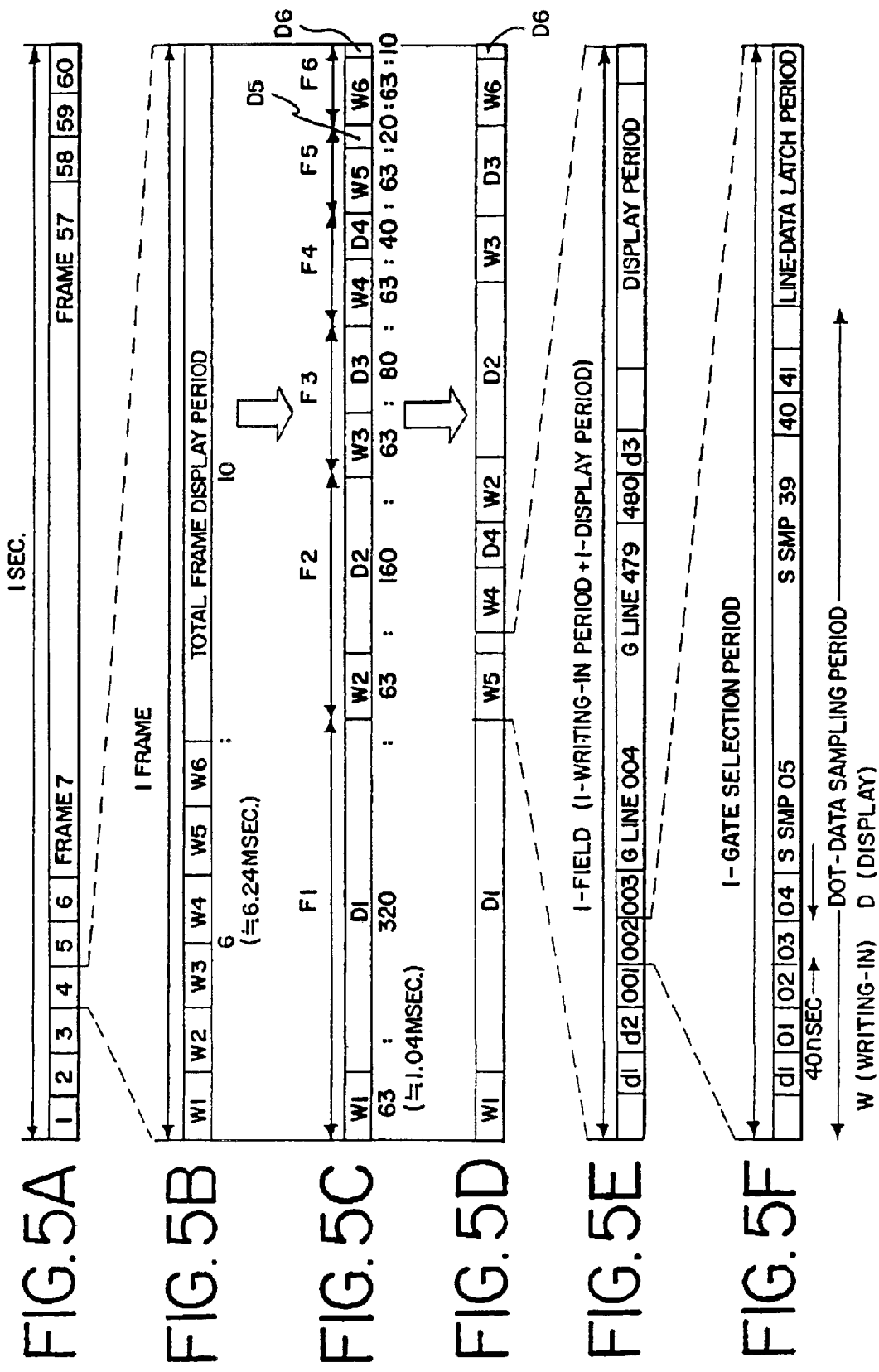

M1, M2; L=12, W=35×2 [μm]
C1; S=0.14×0.14 [mm] (GTO-Al)
R1; L=800, W=10 [μm] (Al), R2; L=591, W=3 [μm] (LDDSi)

FIG.15
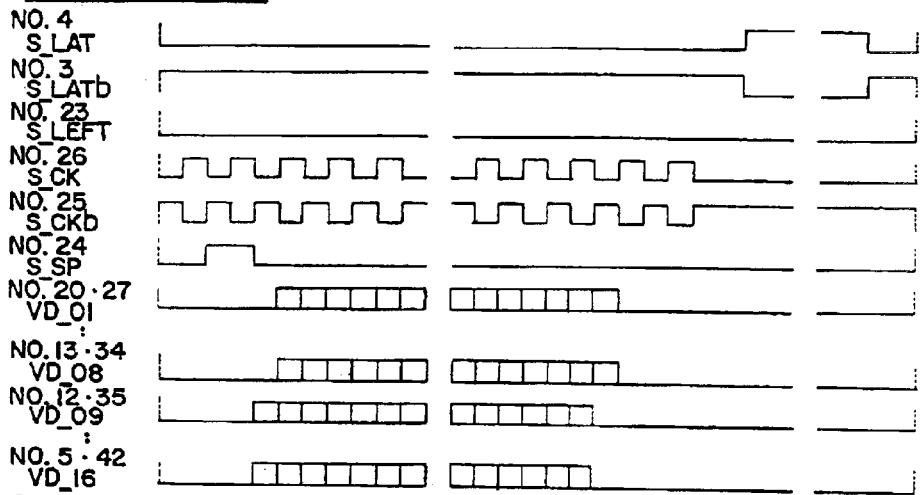
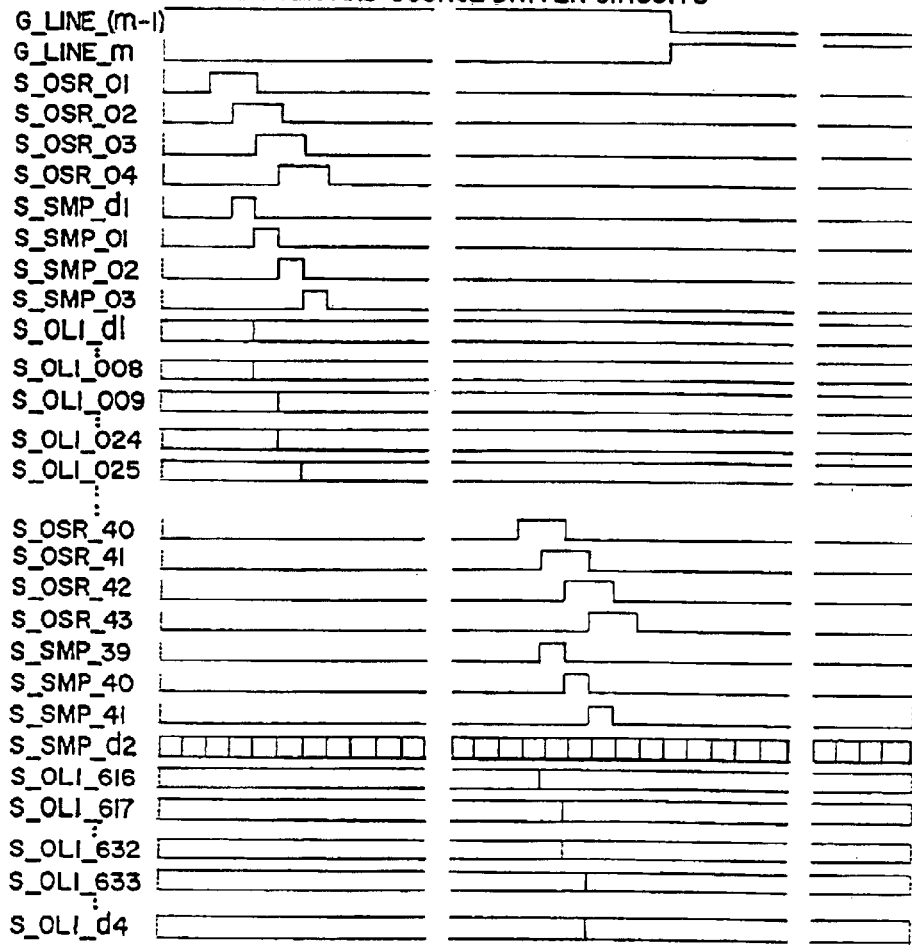

FIG. 16
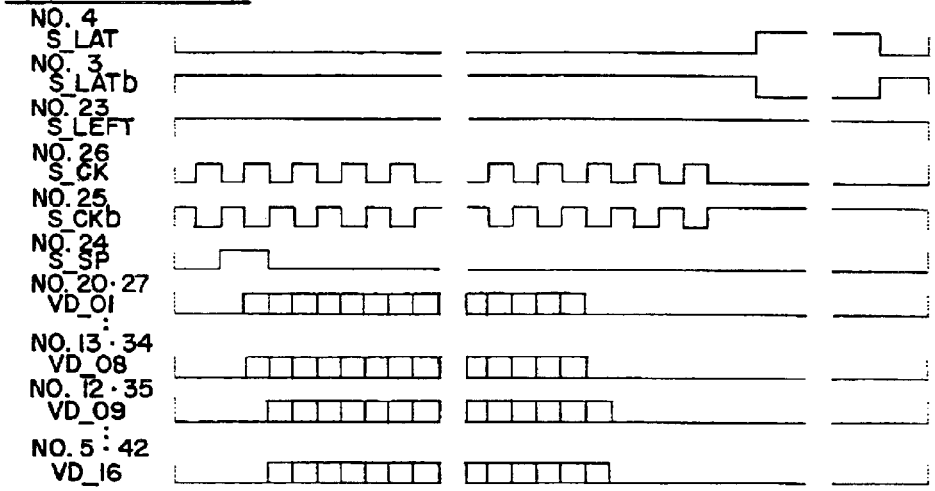
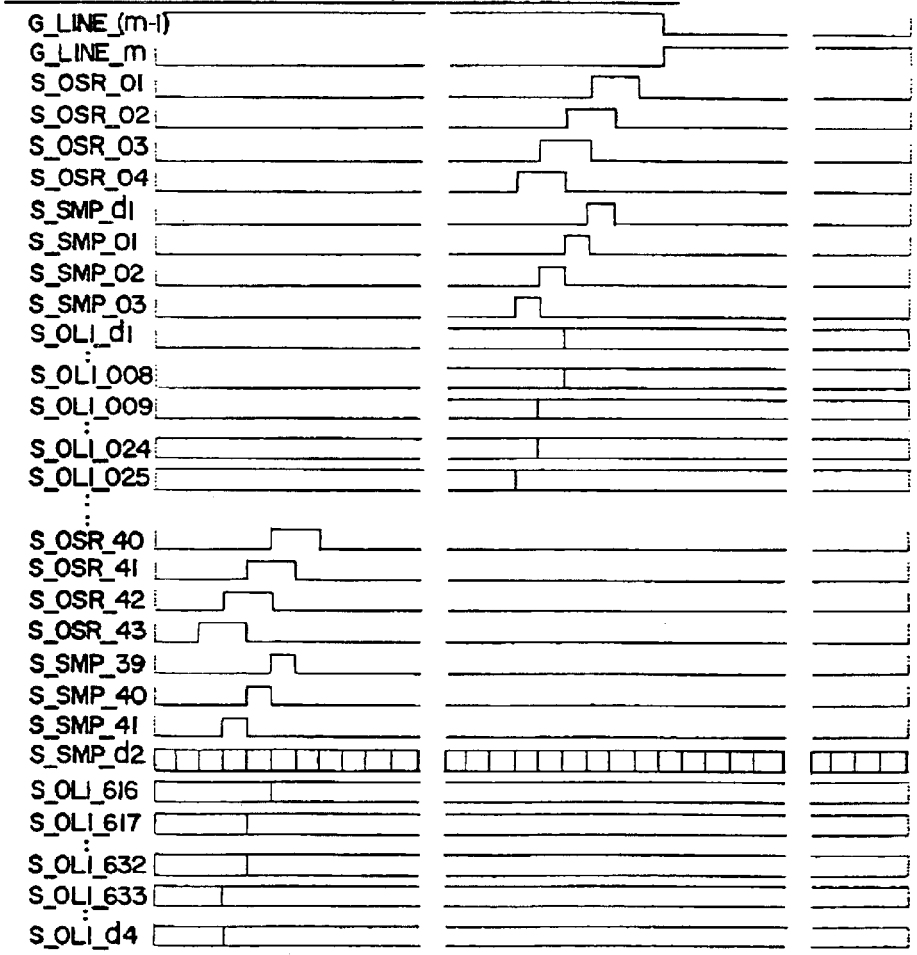

EL DISPLAY DEVICE AND ELECTRONIC APPARATUS

This application is a continuation of U.S. application Ser. No. 09/715,528, filed on Nov. 17, 2000 now U.S. Pat. No. 6,680,577.

BACKGROUND OF THE INVENTION

1. Field of the Invention

The present invention relates to an EL (electroluminescence) display device formed by a semiconductor element (an element using a semiconductor thin film) made on a substrate, and to an electronic apparatus having the EL display device as a display (display portion).

2. Description of the Related Art

Techniques of forming a TFT on a substrate have been greatly advancing in recent years, and development of applications to an active matrix type display device have been progressing. In particular, a TFT using a polysilicon film has a higher electric field effect mobility (also referred to as mobility) than a TFT which uses a conventional amorphous silicon film, and high speed operation is therefore possible.

Shown in FIG. 3 is a general pixel structure of an active matrix type EL display device. Reference numeral 301 in FIG. 3 denotes a TFT which functions as a switching element (hereafter referred to as a switching TFT), reference numeral 302 denotes a TFT which functions as an element (hereafter referred to as an electric current control element) for controlling electric current provided to an EL element 303, and 304 denotes a capacitor (storage capacitor). The switching TFT 301 is connected to a gate wiring 305 and to a source wiring (data wiring) 306. A drain of the electric current control TFT 302 is connected to the EL element 303, and a source of the electric current control TFT 302 is connected to an electric current supply wiring 307.

A gate of the switching TFT 301 opens when the gate wiring 305 is selected, a data signal of the source wiring 306 is stored in the capacitor 304, and a gate of the electric current control TFT 302 opens. After the gate of the switching TFT 301 closes, the gate of the electric current control TFT 302 remains open in accordance with the electric charges stored in the capacitor 304, and the EL element 303 emits light during that period. The amount of light emitted by the EL element 303 is changed by the amount of electric current.

In other words, the amount of electric current flowing in the electric current control TFT 302 is controlled by the data signal input from the source wiring 306 in an analog drive gradation display, and the amount of light emitted by the EL element thereby changes.

FIG. 4A is a graph showing the transistor characteristics of the electric current control TFT 302, and reference numeral 401 denotes an Id-Vg characteristic (also referred to as an Id-Vg curve). Id is a drain current, and Vg is a gate voltage here. The amount of electric current flowing with respect to an arbitrary gate voltage can be found with this graph.

A region of the Id-Vg characteristic shown by a dotted line 402 is normally used in driving the EL elements. An enlargement of the region enclosed by the region 402 is shown in FIG. 4B.

The shaded region in FIG. 4B is referred to as a sub-threshold region. In practice, this indicates a region having a gate voltage in the neighborhood of the threshold voltage (Vth) or below, and the drain current changes exponentially with respect to changes in the gate voltage within this region. Electric current control is performed in accordance with the gate voltage by using this region.

The data signal input to the pixel when the switching TFT 301 in FIG. 3 is open is first stored in the capacitor 304, and then the signal becomes the gate voltage of the electric current control TFT 302, as is. The drain current is determined at this time by a one to one correspondence with respect to the gate voltage, in accordance with the Id-Vg characteristic shown in FIG. 4A. Namely, a predetermined electric current flows in the EL element 303 in correspondence with the data signal, and the EL element 303 emits light with the amount of light corresponding to the amount of current flow.

The amount of light emitted by the EL element is thus controlled by the input signal, and gradation display is performed by controlling the amount of light emitted. This method is referred to as analog gradation, and gradation display is performed by changing the amplitude of the signal.

However, the above analog gradation method has a disadvantage of being extremely weak with respect to dispersions in the TFT characteristics. For example, suppose that the Id-Vg characteristic is a switching TFT and differs from that of a switching TFT of an adjacent pixel displaying the same gradation (a case of an overall positive of negative shift).

In this case the drain current of each switching TFT differs on the order of the dispersion, and the gate voltages applied to the current control TFTs of each pixel therefore also differ. In other words, the electric current flowing differs for each of the EL elements, and as a result, the amount of light emitted also differs, and the same gradation display cannot be performed.

Further, even supposing that equal gate voltages are applied to the electric current control TFTs of each pixel, the same drain current cannot be output if there are variations in the Id-Vg characteristics of the electric current control TFTs. In addition, even if equal gate voltages are applied, the amount of electric current output differs greatly if even small deviations exist in the Id-Vg characteristics when using a region in which the drain current changes exponentially with respect to changes in the gate voltage, as is clear from FIG. 4A. The amount of light emitted by adjacent pixels will differ greatly as a result.

In practice, there is a multiplier effect between dispersions in both the switching TFTs and the electric current control TFTs, and this makes achieving the conditions more difficult. Thus the analog gradation method is extremely sensitive with respect to variations in the TFT characteristics, and this becomes an obstacle to multiple colorization of a conventional active matrix EL display device.

SUMMARY OF THE INVENTION

In consideration of the above problems, an object of the present invention is to provide an active matrix type EL display device capable of sharp, multi-gradation color display. In addition, an object of the present invention is to provide a high performance electrical apparatus furnished as a display portion of this type of active matrix EL display device.

The applicant of the present invention considers that in order to make a pixel structure which is not readily influenced by dispersions in TFT characteristics, a digital driver gradation method, in which an electric current control TFT is used as a simple electric current supply switching element, is better than a conventional analog driver gradation method of controlling the amount of light emitted by an EL element in accordance with electric current control.

It is considered that a time division method of gradation display (hereafter referred to as time division gradation) will be performed by a digital driver in the active matrix type EL display device.

In addition, a panel display can be made higher speed by dividing video lines and inputting a plurality of data at one time when inputting a video signal into a source driver circuit. Note that the video signal referred to here is a data signal input into the source driver circuit throughout this specification.

FIGS. 5A to 5F show the overall driver timing of the write-in period and the display period when performing time division gradation display. A case of performing 64 gradation display in accordance with a 6 bit digital driver method is explained here. Note that the write-in period is the time required for a signal to be written into all pixels structuring one frame, and that the display period is the period in which the pixels perform display of the write-in signal.

An EL driver power supply is cut (all pixels turn off) during the write-in period, and the EL elements within the pixels are in a state of no applied voltage. Further, the EL driver power supply is input during the display period, placing the EL elements within the pixels in a state of having an applied voltage. At this point the pixels turn on when the data signal for turning on the pixels is input.

A period in which an image is completely displayed in an image region is referred to as one frame period. The oscillation frequency of a normal EL display is 60 Hz, and 60 frames exist during one second, as shown in FIG. 5A. For example, when performing 6 bit digital gradation display (64 gradations) in a fourth frame, if one frame is divided into 16 partitions and the ratio of the write-in period to the display period is determined as 6:10, then writing in can be performed 6 times (≈6.24 msec) during the write-in period, as shown in FIG. 5B. Note that the six write-ins 1 to 6 are performed in order from 1 to 6. Further, the display periods corresponding to the write-in periods (from write-in 1 to write-in 6) are set as displays 1 to 6, respectively.

Furthermore, the display periods are set so that display 1: display 2: display 3: display 4: display 5: display 6=1: ½: ¼: ⅛: 1/16: 1/32.

FIG. 5C shows a state in which each display period has the above stated ratios with respect to the write-ins when performing 6 write-ins (write-in 1 to write-in 6) during one frame. The values shown in the lower portion of FIG. 5C show the relationship between the lengths of the write-in periods and the display periods.

Specifically, the display period (display 1) in the write-in 1 shows a value of 320 when the write-in period is 63. In addition, the display 2 has a display period of 160, the display 3 has a display period of 80, the display 4 has a display period of 40, the display 5 has a display period of 20, and the display 6 has a display period of 10 with respect to each of the write-in periods having a value of 63.

One write-in period (write-in) and one display period (display) together are referred to as one field. Namely, six fields exist in FIG. 5C, all having constant write-in periods and differing display periods. In order to complete one frame here, the first field displayed at the beginning is referred to as a field 1 (F1), and the fields displayed subsequently below are referred to as fields 2 to 6 (F2 to F6), in order.

Note that the order of appearance of the fields 1 to 6 may be arbitrary. By combining the display periods, a desired gradation display, from among the 64 gradations, can be performed.

Further, in practice the timing is a combination of the six dispersed fields having different display periods, as shown in FIG. 5D.

If predetermined pixels are turned on during the period of the display 1 in FIG. 5D, then the write-in 5 is entered and after the data signal is input to all of the pixels, the display 5 is entered. Next, the display 4 is entered after the data signal is input to all of the pixels in the write-in 4. Predetermined pixels are also similarly turned on by the respective fields in the write-in 2, the write-in 3, and the write-in 6.

FIG. 5E shows the period during which the data, with which a certain gate line is selected by the data signal input from a gate circuit in the field 5 from among the six fields shown in FIG. 5D, is written (the write-in 5). FIG. 5E also shows the display period (the display S) in which the signal from a source line input from a source line to the selected gate line and the pixels perform display.

FIGS. 5A to 5E are based on a VGA (640×480) panel display, and therefore there are 480 gate wirings and in addition, a period for selecting all of the gate lines, including a certain number of dummies, is a write-in period of FIG. 5E.

The signal input from the source lines in the write-in period is referred to as dot data. The dot data input from a source driver circuit during one gate selection period is sampled during a period shown in FIG. 5F. This shows the gate data selected during the write-in period being written in, at the same time as showing the signal input from the source lines being written in. Note that the period for the data to be sampled at one time is 40 nsec.

Note also that the dot data input from the source driver circuit is input at the same time at 16 bits per 40 nsec as shown in FIG. 5F.

In addition, the dot data selected in one gate selection period is stored in a latch 1 (6001) within the source driver circuit shown in FIG. 6 until all of the data sampling is completed. After all sampling is finished, latch data is input from a latch line 6003, and all of the data is moved at once to a latch 2 (6002). Note that a shift register 6004 selects a video signal input from a video line 6006 in accordance with a clock pulse from a clock line 6005.

In addition to the sampling period, a line data latch period formed in FIG. 5F is a period in which a latch signal is input when moving the data from the latch 1 (6001) to the latch 2 (6002), and in which the data is moved.

A pixel structure of an active matrix type EL display device of the present invention is shown in FIG. 7. Reference numeral 701 in FIG. 7 denotes a TFT which functions as a switching element (hereafter referred to as a switching TFT or a pixel switch TFT), reference numeral 702 denotes a TFT (hereafter referred to as an electric current control TFT or an EL driver TFT) which functions as an element (electric current control element) for controlling the electric current supplied to an EL element 703, and reference numeral 704 denotes a capacitor (also referred to as a storage capacitor or a supplementary capacitor). The switching TFT 701 is connected to a gate line 705 and a source line (data line) 706. Further, a drain of the electric current control TFT 702 is connected to the EL element 703, and a source of the electric current control TFT 702 is connected to an electric current supply line (also referred to as an EL driver power supply line) 707.

A gate of the switching TFT 701 opens when the gate line 705 is selected, the data signal from the source line 706 is stored in capacitor 704, and a gate of the electric current control TFT 702 opens. Then, after the gate of the switching TFT 701 closes, the gate of the electric current control TFT 702 remains open in accordance with the electric charge stored in the capacitor 704, and the EL element 703 emits light during that time. The amount of light emitted by the EL element 703 changes by the amount of electric current flowing.

In other words, the gate of the electric current control TFT 702 opens or closes in accordance with the data signal input from the source line 706 in the digital drive gradation display, and if the EL driver power supply is on, electric current flows and the EL element emits light.

The function of the electric current control TFT of the pixel is to control whether or not the corresponding pixel is turned on (display) or is turned off (non-display) during the display period. The switching between the display period and the write-in period is performed by a power source external to the right panel, through an FPC terminal.

Further, an electric power supply attached externally to the panel (reference numeral 709 in FIG. 7) achieves a switching function for switching between the write-in period and the display period. In the write-in period the electric power supply is in an off state (a state in which there is no applied voltage), and the data signal is input to each of the pixels.

After the data in input to all of the pixels and the write-in period is complete, the electric power supply (reference numeral 709 in FIG. 7) in turned on and display is performed all at once. This period becomes the display period. The period in which the EL elements emit light and the pixels are turned on is any of the periods from the display 1 to the display 6 from among the six fields.

After the six fields have appeared, one frame becomes complete. The gradation of a pixel is controlled by adding up the display periods at this point. For example, when the display 1 and the display 2 are selected, a brightness of 76% can be expressed out of a full brightness of 100%, and when the display 3 and the display 5 are selected, a brightness of 16% can be expressed.

Note that although a case of 64 gradations is explained above, it is also possible to perform other gradation displays.

Assuming that N bit (where N is an integer greater than or equal to 2) gradation display is performed ($2^n$ gradations), then first one frame is divided into N fields (F1, F2, F3, ..., F(n−1), F(n)) corresponding to the N bit gradations. The number of divisions of one frame increases with increasing gradations, and the driver circuit must by driven at a high frequency.

In addition, each of the N fields is separated into write-in periods (Ta) and display periods (Ts).

The display periods (note that display periods corresponding to F1, F2, F3, ..., F(n−1), F(n) are expressed as Ts1, Ts2, Ts3, ..., Ts(n−1), Ts(n), respectively) of the N fields are processed so as to become Ts1: Ts2: Ts3: ... : Ts(n−1): Ts(n)=$2^0$: $2^{-1}$: $2^{-2}$: ... : $2^{-(n-2)}$: $2^{-(n-1)}$.

In this state, pixels are selected in order in one arbitrary field (strictly speaking, the switching TFT of each pixel is selected), and the predetermined gate voltage (corresponding to the data signal) is applied to the gate electrodes of the electric current controlling TFTs. The EL elements of pixels to which a data signal, which makes the electric current control TFTs have a continuity state, is input to turn on the pixels for the display periods apportioned to those fields when the electric power supply is input after the write-in period is complete.

This operation is repeated in all the N fields, and gradation of each pixel is controlled in one frame by adding the display periods. Therefore in focusing on one arbitrary pixel, the gradation of one pixel can be controlled on the basis of for how long a period the pixel was lighted in each field (how many display periods have passed).

Thus the most important aspect of the preset invention is that the digital driver time dividing gradation method is used in the active matrix type EL display device. It becomes possible to perform gradation display without any influence from the TFT characteristics, a problem in analog driver gradation display, by using this time division gradation driver.

BRIEF DESCRIPTION OF THE DRAWINGS

In the accompanying drawings:

FIGS. 5A to 5F are diagrams for explaining an operating mode of a time division gradation method;

FIG. 15 is a timing diagram of an input signal from a gate driver circuit side of an EL display device;

FIG. 16 is a timing diagram of an input signal from a gate driver circuit side of an EL display device;

DETAILED DESCRIPTION OF THE PREFERRED EMBODIMENTS

Embodiment Mode

Figure 1A:
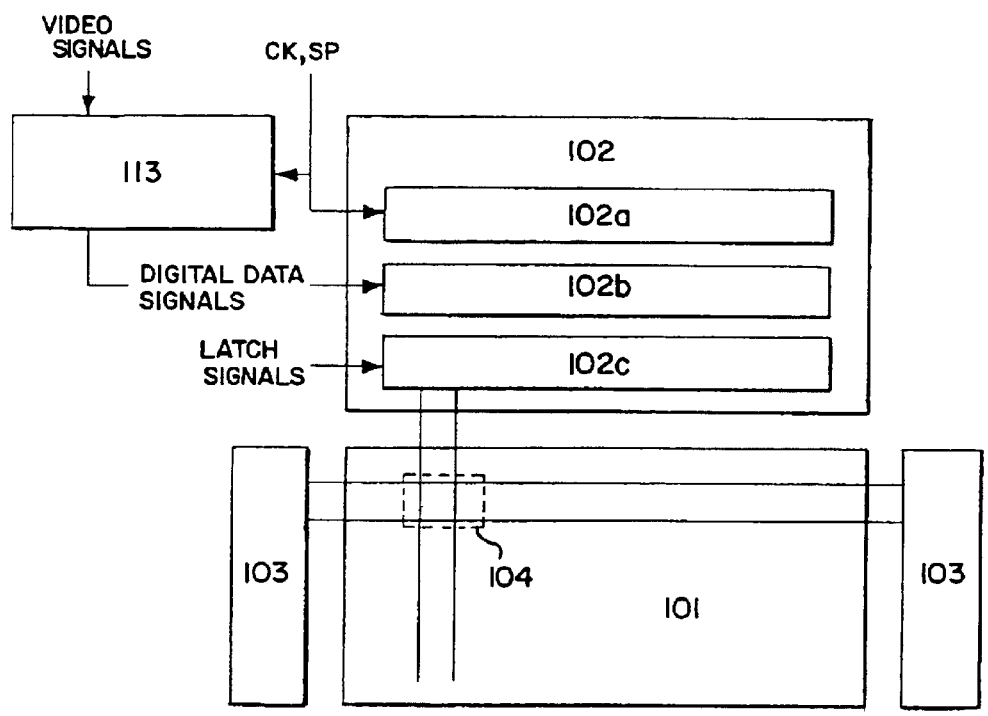
FIGS. 1A and 1B are diagrams showing the structure of an EL display device.
Figure 1B:
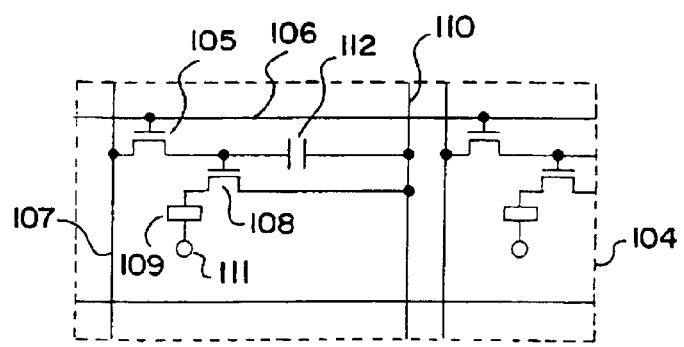

FIG. 1A is a schematic block diagram of an active matrix type EL display device of the present embodiment. The active matrix type EL display device of FIGS. 1A and 1B is formed by a pixel portion 101, and a source driver circuit 102 and a gate driver circuit 103 arranged in the periphery of a pixel portion by TFTs formed on a substrate. Further, reference numeral 113 denotes a time division gradation data signal generation circuit (SPC, serial to parallel conversion circuit).

The source driver circuit 102 has a shift register 102a, and a latch (1) 102b, a latch (2) 102c. In addition, it also has a buffer (not shown in the figures).

Note that only one source driver circuit is formed in the active matrix type EL display device of the present embodiment, but two source driver circuits may be formed so as to sandwich the pixel portion from above and below.

Furthermore, the gate driver circuit 103 has circuits such as a shift register and a buffer (neither shown in the figures).

The pixel portion 101 has 640×480 (horizontal×vertical) pixels. A switching TFT and an electric current control TFT are arranged in each pixel. A switching TFT 105 is connected to a gate line 106 and a source line (data line) 107. Further, a drain of an electric current control TFT 108 is connected to an EL element 109, and a source of the electric current control TFT 108 is connected to an electric current supply line 110.

A gate of the switching TFT 105 opens when the gate line 106 is selected, a data signal of the source line 107 is stored in the capacitor 112, and a gate of the electric current control TFT 108 opens. In other words, electric current flows in the electric current control TFT 108 due to the data signal input from the source line 107, and the EL element emits light.

The operation and the signal flow of the active matrix type EL display device of this embodiment mode are explained here.

The operation of the source driver circuit 102 is explained first. The source driver circuit 102 fundamentally contains the shift register 102a, the latch (1) 102b, and the latch (2) 102c. A clock signal (CK) and a start pulse (SP) are input to the shift register 102a. The shift register 102a generates timing signals in order based on the clock signal (CK) and the start pulse (SP), and the timing signals are supplied in order to subsequent circuits after passing through the buffer (not shown in the figures).

The timing signal from the shift register 102a is buffered and amplified by circuits such as the buffer. The load capacitance (parasitic capacitance) is large in the source line which is supplied with the timing signal because there are many circuits or elements connected. The buffer circuit is formed in order to prevent a "blunting" of rise and fall of the generated timing signal because the load capacitance is large.

The timing signal (Digital Data Signals) which has been buffered and amplified by the buffer is then supplied to the latch (1) 102b. The latch (1) 102b has a latch for processing a six bit digital signal. The latch (1) 102b takes in the six bit digital data signal supplied from a time division gradation data signal generation circuit 113, and stores it, when the above timing signal is input.

The amount of time until completed for the write-in of the digital data signal to all stages of the latch (1) 102b is referred to as the write-in period. In other words, from the point when the digital data signal in the latch of the stage on the furthest left within the latch (1) 102b is written to the point when the digital data signal in the latch of the rightmost stage is written is the write-in period. Further, the above write-in period is also referred to as a line period.

After the write-in period is complete, a latch signal is supplied to the latch (2) 102c in accordance with an operation timing of the shift register 102a. At this instant the digital data signal written in and stored in the latch (1) 102b is output all at once to the latch (2) 102c, and stored in the latch (2) 102c.

Then, after the digital data signal has been sent to the latch (2) 102c, write-in of another digital data signal supplied from the time division gradation data signal generation circuit 113 is again performed in order based upon a timing signal from the shift register 102a.

Furthermore, a latch signal is input to the latch (2) 102c.

A timing signal from a shift register (not shown in the figures) is supplied in the gate driver circuit 103, and is supplied to the corresponding gate lines (scanning lines).

Reference numeral 113 is the time division gradation data signal generation circuit (SPC, serial to parallel conversion circuit). The time division gradation data signal generation circuit 113 is a circuit for reducing the frequency of a digital signal input from the outside to 1/m. By dividing the externally input digital signal, the signal frequency required for operation of the driver circuit can also be reduced to 1/m.

The data signal input to the pixel portion is a digital signal, and furthermore differing from a liquid crystal display device the present invention is not a voltage gradation display, and therefore the digital data signal having "0" or "1" information is input, as is, to the pixel portion.

A plurality of pixels 104 are arranged in a matrix state in the pixel portion 101. An enlarged view of the pixel 104 is shown in FIG. 1B. Reference numeral 105 denotes the switching TFT in FIG. 1B, and the switching TFT 105 is connected to the gate line 106 for inputting the gate signal and to the source wiring 107 for inputting the video signal.

Further, reference numeral 108 is the electric current control TFT, and its gate is connected to the drain of the switching TFT 105. The drain of the electric current control TFT 108 is connected to the EL element 109, and its source is connected to the electric current supply line 110. The EL element 109 is composed of an anode (pixel electrode) connected to the electric current control TFT 108, and a cathode (opposing electrode) formed in opposition to the anode and sandwiching an EL layer, and the cathode is connected to a predetermined electric power supply 111.

Note that the switching TFT 105 may be an n-channel TFT and may be a p-channel TFT.

The electric current control TFT has a structure such that when the electric current control TFT 108 is an n-channel TFT, the drain portion of the electric current control TFT 108 is connected to the cathode of the EL element 109, and for a case of using a p-channel TFT for the electric current control TFT 108, the drain portion of the electric current control TFT 108 is connected to the anode of the EL element 109.

Further, the capacitor 112 is formed in order to store the gate voltage of the electric current control TFT 108 when the switching TFT 105 is in a non-selected state (off state). The capacitor 112 is connected to the drain of the switching TFT 105 and to the electric current supply line 110.

A digital data signal input to the pixel portion as described above is formed by the time division gradation data signal generation circuit 113. This circuit is one in which the video signal made from the digital signal (the signal includes picture information) is transformed into a digital data signal for performing time division gradation, and a circuit in which the timing pulses necessary for performing time division gradation display and the like are generated.

Typically, means for dividing one frame into a plurality of fields corresponding to N bit (where N is an integer greater than or equal to 2) gradations, means for selecting the write-in periods and the display periods in the plurality of fields, and means for setting the display periods so as to become $Ts1: Ts2: Ts3: \ldots : Ts(n-1): Ts(n) = 2^0 : 2^{-1} : 2^{-2} : \ldots : 2^{-(n-2)} : 2^{-(n-1)}$. are contained in the time division gradation digital signal generation circuit 113.

The time division gradation digital signal generation circuit 113 may be formed external to the EL display device of the present invention, and it may also be integrally formed. When forming the circuit external to the EL display device, there is a structure in which the digital data signal formed externally is input to the EL display device of the present invention.

Figure 2:
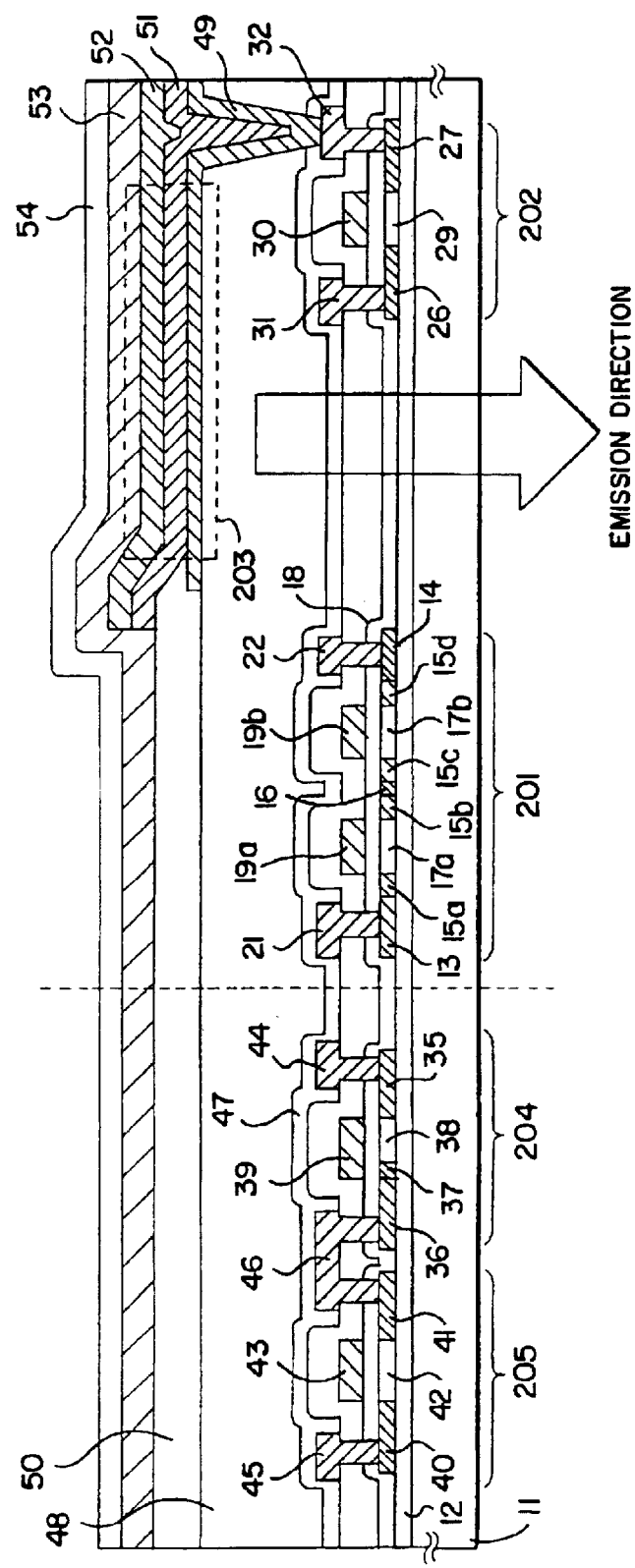
FIG. 2 is a diagram showing a cross sectional structure of an EL display device.
Figure 3:
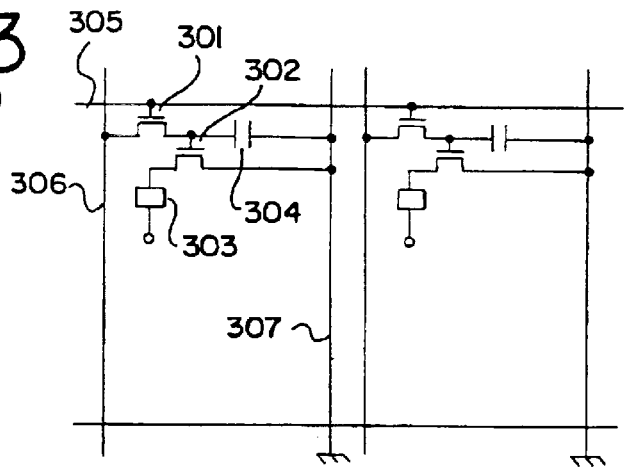
FIG. 3 is a diagram showing the structure of a pixel portion in a conventional EL display device.

Next, a schematic of a cross sectional structure of the active matrix EL display device of the present invention is shown in FIG. 2.

Reference numeral 11 denotes a substrate, and reference numeral 12 denotes an insulating film which becomes a base (hereafter referred to as a base film) in FIG. 2. A substrate transparent to light, typically a glass substrate, a quartz substrate, a glass ceramic substrate, or a crystallized glass substrate can be used as the substrate 11. Note that the substrate used must be able to withstand the highest processing temperature of the manufacturing process.

Further, the base film 12 is especially effective for cases in which a substrate containing mobile ions, or a substrate having conductivity is used, but need not be formed for a quartz substrate. An insulating film containing silicon may be used to form the base film 12. Note that the term "insulating film containing silicon" indicates, specifically, an insulating film such as a silicon oxide film, a silicon nitride film, or an oxidized silicon nitride film (denoted by $SiO_xN_y$, where x and y are shown by arbitrary integers) containing silicon, oxygen, and nitrogen in predetermined ratios in this specification.

Reference numeral 201 denotes a switching TFT, formed by an n-channel TFT, but the switching TFT may also be formed as a p-channel TFT. Reference numeral 202 denotes a current control TFT, and FIG. 2 shows a case in which the current control TFT 202 is formed by a p-channel TFT. In other words, the drain electrode of the electric current control TFT is connected to the anode of the EL element in this case. However, the current control TFT is connected to the cathode of the EL element when the electric current control TFT is formed by an n-channel TFT.

The field effect mobility of the n-channel TFT is larger than the field effect mobility of a p-channel TFT, and therefore large electric current can flow at high speed. Further, even with the same amount of current flow, the TFT size of the n-channel TFT can be made smaller.

Note that it is not necessary to limit the switching TFT and the current control TFT to n-channel TFTs in the present invention, and that it is possible to use p-channel TFTs for either the switching TFT, the current control TFT, or both.

The switching TFT 201 is formed having: an active layer containing a source region 13, a drain region 14, LDD regions 15a to 15d, a separating region 16, and channel forming regions 17a and 17b; a gate insulating film 18; gate electrodes 19a and 19b, a first interlayer insulating film 20, a source wiring 21, and a drain wiring 22. Note that the gate insulating film 18 or the first interlayer insulating film 20 may be made common among all TFTs on the substrate, and may also be made to differ corresponding to a circuit or an element.

The switching TFT 201 shown in FIG. 2A has the gate electrodes 19a and 19b electrically connected, becoming a so-called double gate structure. Of course, not only a double gate structure, but a multi-gate structure (a structure containing an active layer having two or more channel forming regions connected in series), such as a triple gate structure, may also be used.

The multi-gate structure is extremely effective in lowering the value of the off current, and by sufficiently lowering the off current of the switching TFT, it becomes possible to reduce the capacity needed for the capacitor 112 shown in FIG. 1B. Namely, the exclusive surface area of the capacitor 112 can be made smaller, and therefore the multi-gate structure is also effective in increasing the effective light emitting surface area of the EL element 109.

In addition, the LDD regions 15a to 15d in the switching TFT 201 are formed sandwiching the gate insulating film 18, and so as not to overlay with the gate electrodes 17a and 17b. This structure is extremely effective in reducing the off current value. Furthermore, the length (width) of the LDD regions 15a to 15d may be set from 0.5 to 3.5 μm, typically between 2.0 and 2.5 μm.

Note that the formation of an offset region (a region having the same composition as the channel forming regions, and to which a gate voltage is not applied) between the channel forming regions and the LDD regions is more preferable for reducing the off current value. Further, when a multi-gate structure having two of more gate electrodes is used, the separating region 16 (a region in which the same impurity element is added, and at the same concentration, as that of the source region or the drain region) formed between the channel forming regions is effective in lowering the value of the off current.

Next, the current control TFT 202 is formed having: a source region 26, a drain region 27, and a channel forming region 29; the gate insulating film 18; a gate electrode 30; the first interlayer insulating film 20; a source wiring 31; and a drain wiring 32. Note that the gate electrode 30 has a single gate structure, but a multi-gate structure may also be used.

As shown in FIG. 1B, the drain of the switching TFT 201 is electrically connected to the gate of the current control TFT 202. Specifically, the gate electrode 30 of the current control TFT 202 is electrically connected to the drain region 14 of the switching TFT 201 through the drain wiring (also referred to as a connection wiring) 22. Further, the source wiring 31 is connected to an electric current supply wiring 110 in FIG. 1B.

Further, looking from the viewpoint of increasing the amount of current that is able to flow, it is also effective to make the film thickness of the active layer (especially the channel forming region) of the current control TFT 202 thick (preferably from 50 to 100 nm, more preferably between 60 and 80 nm). Conversely, looking from the point of view of making the off current value smaller for the switching TFT 201, it is also effective to make the film thickness of the active layer (especially the channel forming region) thin (preferably from 20 to 50 nm, more preferably between 25 and 40 nm).

The structure of the TFT formed within the pixel is explained above, but a driver circuit is also formed at the same time. A CMOS circuit, the basic unit forming the driver circuit, is shown in FIG. 2.

In FIG. 2, a TFT having a structure which reduces hot carrier injection as much as possible, without dropping the operation speed, is used as an n-channel TFT 204 of the CMOS circuit. Note that the driver circuit referred to here indicates the source driver circuit 102 and the gate signal driver circuit 103 shown in FIG. 1A. It is also possible to form other signal processing circuit, of course (such as a level shifter, an A/D converter, or a signal divider circuit).

An active layer of the n-channel TFT 204 contains a source region 35, a drain region 36, an LDD region 37, and a channel forming region 38, and the LDD region 37 overlaps a gate electrode 39, sandwiching the gate insulating film 18. The LDD region 37 is referred to as an Lov region throughout this specification.

The formation of the LDD region on only the drain region side is in consideration of not lowering the operation speed. Further, it is not necessary to be very concerned with the value of the off current in the n-channel TFT 204, and greater emphasis should be placed on the operation speed. It is therefore preferable that the LDD region 37 completely overlaps the gate electrode, reducing resistive components as much as possible. In other words, it is good to eliminate all offset.

Deterioration by hot carrier injection of a p-channel TFT 205 of the CMOS circuit is almost of no concern, and in particular, an LDD region need not be formed. The active layer therefore contains a source region 40, a drain region 41, and a channel forming region 42, and the gate insulating film 18 and a gate electrode 43 are formed on top. It is also possible, of course, to take action against hot carriers by forming an LDD region similar to that of the n-channel TFT 204.

Further, the n-channel TFT 204 and the p-channel TFT 205 are each covered by the first interlayer insulating film 20, and source wirings 44 and 45 are formed. In addition, both are electrically connected by a drain wiring 46.

Next, reference numeral 47 denotes a first passivation film, and its film thickness may be set from 10 nm to 1 µm (preferably between 200 and 500 nm). An insulating film containing silicon (in particular, it is preferable to use an oxidized silicon nitride film or a silicon nitride film) can be used as the passivation film material. The passivation film 47 possesses a role of protecting the formed TFTs from alkaline metals and moisture. In the final EL layer to be provided on the upper part of the TFT, alkaline metal such as sodium is included. In other words, the first passivation film 47 works also as a protecting layer so that these alkaline metals (mobile ions) do not penetrate into the TFT. However, it is not always necessary to form this passivation film, and when necessary, it may be formed.

Further, reference numeral 48 denotes a second interlayer insulating film, which has a function as a leveling film for performing leveling of a step due to the TFTs. An organic resin film is preferable as the second interlayer insulating film 48, and one such as polyimide, polyamide, acrylic, or BCB (benzocyclobutene) may be used. These organic resin films have the advantages of easily forming a good, level surface, and having a low specific dielectric constant. The EL layer is extremely sensitive to unevenness, and therefore it is preferable to nearly absorb all the TFT step by the second interlayer insulating film. In addition, it is preferable to form the low specific dielectric constant material thickly for reducing the parasitic capacitance formed between a gate wiring or data wiring and the cathode of the EL element. The thickness, therefore, is preferably from 0.5 to 5 µm (more preferably between 1.5 and 2.5 µm).

Further, reference numeral 49 denotes a pixel electrode made from a transparent conducting film. After opening a contact hole in the second interlayer insulating film 48 and in the first passivation film 47, the pixel electrode 49 is formed so as to be connected to the drain wiring 32 of the current control TFT 202. Note that if the pixel electrode 49 and the drain region 27 are directly connected, as in FIG. 2, then alkaline metals of the EL layer can be prevented from entering the active layer via the pixel electrode.

A third interlayer insulating film 50 is formed on the pixel electrode 49 from a silicon oxide film, an oxidized silicon nitride film, or an organic resin film, with a thickness from 0.3 to 1 µm. An open portion is formed in the third interlayer insulating film 50 over the pixel electrode 49 by etching, and the edge of the open portion is etched so as to become a tapered shape. The taper angle may be set from 10 to 60°, (preferably between 30 and 50°).

An EL layer 51 is formed on the third interlayer insulating film 50. A single layer structure or a lamination structure can be used for the EL layer 51, but the lamination structure has good light emitting efficiency. In general, a hole injecting layer, a hole transporting layer, an emitting layer, and an electron transporting layer are formed in order on the pixel electrode, but a structure having a hole transporting layer, an emitting layer, and an electron transporting layer, or a structure having a hole injecting layer, a hole transporting layer, an emitting layer, an electron transporting layer, and an electron injecting layer may also be used. Any known structure may be used in the present invention, and doping of a fluorescing pigment and the like into the EL layer may also be performed.

Known materials can be used as the organic EL materials, and for example, the materials disclosed in the following U.S. Patents and Japanese patent applications can be used: U.S. Pat. No. 4,356,429; U.S. Pat. No. 4,539,507; U.S. Pat. No. 4,720,432; U.S. Pat. No. 4,769,292; U.S. Pat. No. 4,885,211; U.S. Pat. No. 4,950,950; U.S. Pat. No. 5,059,861; U.S. Pat. No. 5,047,687; U.S. Pat. No. 5,073,446; U.S. Pat. No. 5,059,862; U.S. Pat. No. 5,061,617; U.S. Pat. No. 5,151,629; U.S. Pat. No. 5,294,869; U.S. Pat. No. 5,294,870; Japanese Patent Application Laid-open No. Hei 10-189525; Japanese Patent Application Laid-open No. Hei 8-241048; and Japanese Patent Application Laid-open No. Hei 8-78159.

Note that EL display devices are roughly divided into four types of color display methods: a method of forming three types of EL elements corresponding to R, G, and B; a method of combining white color luminescing EL elements with color filters; a method of combining blue or blue-green luminescing EL elements and fluorescent matter (fluorescing color change layer, CCM); and a method of using a transparent electrode as a cathode (opposing electrode) and overlapping EL elements corresponding to R, G, and B.

The structure of FIG. 2 is an example of a case of forming three types of EL elements corresponding to R, G, and B. Note that although only one pixel is shown in FIG. 2, pixels having an identical structure are formed corresponding to red, green and blue colors, respectively, and that color display can thus be performed.

It is possible to implement the present invention without regard to the method of luminescence, and all of the above four methods can be used in the present invention. However, compared with EL, a fluorescing body has the problems of slow response speed and afterglow, and therefore it is preferable to not use a fluorescing body. Further, it is also preferable to not use any color filters, which becomes the cause of the brightness of the emitted light to drop.

A cathode 52 of an EL element is formed on the EL layer 51. A material containing a low work coefficient material such as magnesium (Mg), lithium (Li), or calcium (Ca), is used as the cathode 52. Preferably, an electrode made from MgAg (a material made from Mg and Ag at a mixture of Mg:Ag=10:1) is used. In addition, a MgAgAl electrode, an LiAl electrode, and an LiFAl electrode can be given as other examples.

It is preferable to form the cathode 52 in succession, without exposure to the atmosphere, after forming the EL layer 51. This is because the interface state between the cathode 52 and the EL layer 51 greatly influences the light emitting efficiency of the EL element. Note that, throughout this specification, a light emitting element formed by a pixel electrode (anode), an EL layer, and a cathode is referred to as an EL element.

The lamination body composed of the EL layer 51 and the cathode 52 need to be formed separately for each pixel, but the EL layer 51 is extremely weak with respect to moisture, and therefore a normal photolithography technique cannot be used. It is therefore preferable to use a physical mask material such as a metal mask, and to selectively form the layers by a gas phase method such as vacuum evaporation, sputtering, or plasma CVD.

Note that it is also possible to use a method such as ink jet printing or screen printing as the method of selectively forming the EL layer. However, the cathode cannot currently be formed in succession with these methods, and therefore it seems preferable to use the other methods stated above.

Further, reference numeral 53 denotes a protecting electrode, which protects the cathode 52 from external moisture and the like at the same time is an electrode for connecting to the cathode 52 of each pixel. It is preferable to use a low resistance material containing aluminum (Al), copper (Cu), or silver (Ag) as the protecting electrode 53. The protecting electrode 53 can also be expected to have a heat radiating effect which relieves the amount of heat generated by the EL layer. In addition, it is effective to form the protecting electrode 53 in succession, without exposure to the atmosphere, after forming the above EL layer 51 and the cathode 52.

Further, reference numeral 54 denotes a second passivation film, and the film thickness may be set from 10 nm to 1 μm (preferable between 200 and 500 nm). The aim of forming the second passivation film is mainly in order to protect the EL layer 51 from moisture, but it is also effective if it is given a heat radiating effect. Note that the above stated EL layer is weak with respect to heat, and therefore it is preferable for film deposition to be performed at as low a temperature as possible (preferably in a temperature range from room temperature to 120° C.). Therefore plasma CVD, sputtering, vacuum evaporation, ion plating, and solution application (spin coating) are preferable methods of film deposition. However, it is not always necessary to form the second passivation film 54, and when required, it should be formed.

The main point of the present invention is to improve on the problem of dispersion in TFT characteristics, which has become a problem in analog drive gradation up to now, changing the analog drive gradation display to a digital drive time division gradation display in an active matrix type EL display device. Therefore, the present invention is not limited to the structure of the EL display device of FIG. 2, and the structure of FIG. 2 is only one preferable form of implementing the present invention.

The above TFTs using a polysilicon film have high speed operation, but easily deteriorate due to causes such as hot carrier injection. Therefore, as shown in FIG. 2, the formation of TFTs within the pixel having a structure which differs in response to their function (the switching TFT with sufficiently low off current and the electric current control TFT which is strong with respect to hot carrier injection) provides high reliability. Further, it is extremely effective in the manufacture of an EL display device capable of good image display (good motion functionality).

Embodiment 1

An embodiment of the present invention is explained using FIGS. 9 to 16 and Tables 1 to 4.

A pixel portion used when implementing the present invention, a circuit structure and specifications (such as size and voltage values) of a driver formed in the periphery of the pixel portion, and an input signal are explained here.

Figure 9:
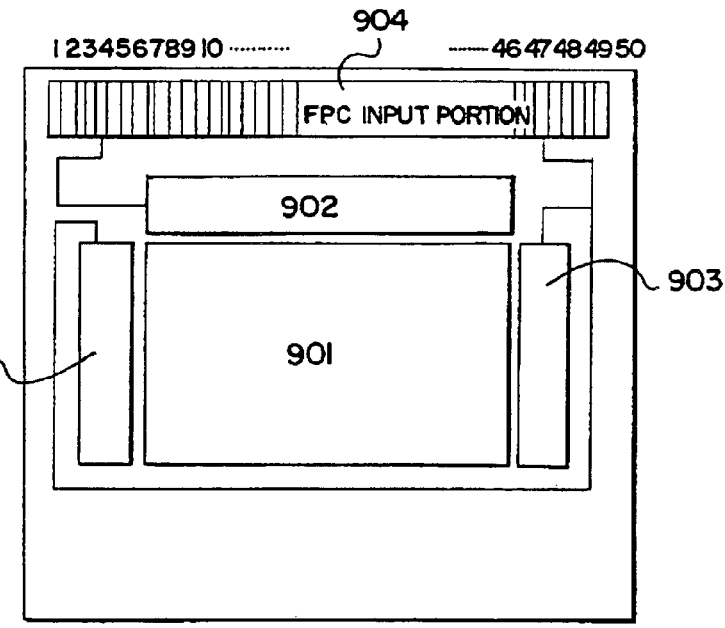
FIG. 9 is a top view of a complete EL display device panel.

FIG. 9 is a plane diagram of a complete panel as seen from above (from a cathode film deposition side). Display is performed facing the bottom. Reference numeral 901 in FIG. 9 denotes a pixel portion, reference numeral 902 denotes a source driver circuit, 903 denotes a gate driver circuit, and 904 denotes an input portion of a flexible printed circuit (hereafter referred to as FPC). Note that the FPC input portion 904 used in embodiment 1 has 50 terminals at a 300 μm pitch.

Figure 10:
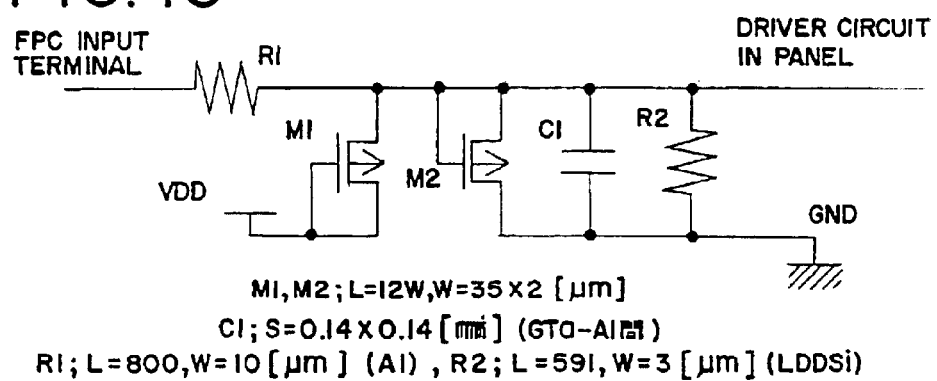
FIG. 10 is a protecting circuit of an FPC input portion.

The FPC input portion 904 of FIG. 9 in embodiment 1 has a circuit for protecting the FPC input portion, as shown in FIG. 10. Note that video signal input terminals (terminals 5 to 20 and 27 to 42 from among terminals 1 to 50 attached in the upper portion of the FPC input portion 904 in FIG. 9) do not have resistors (R1).

Note also that the portions of the FPC input terminal portion having the protecting circuit are all numbers 1 to 50 attached in the top portion of the FPC input portion 904 in FIG. 9, except for numbers 1, 2, 21, 22, 43, 44, 49, and 50.

In addition, Table 1 shows the specifications of the FPC input terminals used in embodiment 1. Note that the term "terminal No." shown in Table 1 corresponds to the numbers 1 to 50 attached to the top portion of the FPC input portion 904 in FIG. 9.

TABLE 1

| Terminal No. | Terminal Symbol | Signal Type | Voltage Range [V] | Notes (Name of Signals etc.) |
|---|---|---|---|---|
|  |  | NC |  | Pad only |
| 1 | EL_CATH | Unbalance | approximately 4 (0.0~9.0)/9 | EL Driver D.C. Power Source (Cathode) |
| 2 | EL_ANOD | Power Source | 9 | EL Driver D.C. Power Source (Anode) |
| 3 | S_LATb | Unbalance | 0.0/9.0 | Source Driver Circuit Latch Inverted Signal |
| 4 | S_LAT | Unbalance | 0.0/9.0 | Source Driver Circuit Latch Signal |
| 5 | VD_16 | Unbalance | 0.0/9.0 | Digital Video Signal 16 |
| 6 | VD_15 | Unbalance | 0.0/9.0 | Digital Video Signal 15 |
| 7 | VD_14 | Unbalance | 0.0/9.0 | Digital Video Signal 14 |
| 8 | VD_13 | Unbalance | 0.0/9.0 | Digital Video Signal 13 |
| 9 | VD_12 | Unbalance | 0.0/9.0 | Digital Video Signal 12 |
| 10 | VD_11 | Unbalance | 0.0/9.0 | Digital Video Signal 11 |
| 11 | VD_10 | Unbalance | 0.0/9.0 | Digital Video Signal 10 |
| 12 | VD_09 | Unbalance | 0.0/9.0 | Digital Video Signal 9 |
| 13 | VD_08 | Unbalance | 0.0/9.0 | Digital Video Signal 8 |
| 14 | VD_07 | Unbalance | 0.0/9.0 | Digital Video Signal 7 |
| 15 | VD_06 | Unbalance | 0.0/9.0 | Digital Video Signal 6 |
| 16 | VD_05 | Unbalance | 0.0/9.0 | Digital Video Signal 5 |
| 17 | VD_04 | Unbalance | 0.0/9.0 | Digital Video Signal 4 |
| 18 | VD_03 | Unbalance | 0.0/9.0 | Digital Video Signal 3 |
| 19 | VD_02 | Unbalance | 0.0/9.0 | Digital Video Signal 2 |
| 20 | VD_01 | Unbalance | 0.0/9.0 | Digital Video Signal 1 |
| 21 | S_GND | Power Source | 0 | Source Driver Circuit Negative Power Source |
| 22 | S_VDD | Power Source | 9 | Source Driver Circuit Positive Power Source |
| 23 | S_LEFT | Power Source | 0.0 or 9.0 | Source Driver Circuit Scanning Direction Selector (0.0: Right Scanning 9.0: Left Scanning) |
| 24 | S_SP | Unbalance | 0.0/9.0 | Source Driver Circuit Start Pulse Signal |
| 25 | S_CKb | Balance | 0.0/9.0 | Source Driver Circuit Clock Inverted Signal |
| 26 | S_CK | Balance | 0.0/9.0 | Source Driver Circuit Clock Signal |
| 27 | VD_01 | Unbalance | 0.0/9.0 | Digital Video Signal 1 |
| 28 | VD_02 | Unbalance | 0.0/9.0 | Digital Video Signal 2 |
| 29 | VD_03 | Unbalance | 0.0/9.0 | Digital Video Signal 3 |
| 30 | VD_04 | Unbalance | 0.0/9.0 | Digital Video Signal 4 |
| 31 | VD_05 | Unbalance | 0.0/9.0 | Digital Video Signal 5 |
| 32 | VD_06 | Unbalance | 0.0/9.0 | Digital Video Signal 6 |
| 33 | VD_07 | Unbalance | 0.0/9.0 | Digital Video Signal 7 |
| 34 | VD_08 | Unbalance | 0.0/9.0 | Digital Video Signal 8 |
| 35 | VD_09 | Unbalance | 0.0/9.0 | Digital Video Signal 9 |
| 36 | VD_10 | Unbalance | 0.0/9.0 | Digital Video Signal 10 |
| 37 | VD_11 | Unbalance | 0.0/9.0 | Digital Video Signal 11 |
| 38 | VD_12 | Unbalance | 0.0/9.0 | Digital Video Signal 12 |
| 39 | VD_13 | Unbalance | 0.0/9.0 | Digital Video Signal 13 |
| 40 | VD_14 | Unbalance | 0.0/9.0 | Digital Video Signal 14 |
| 41 | VD_15 | Unbalance | 0.0/9.0 | Digital Video Signal 15 |
| 42 | VD_16 | Unbalance | 0.0/9.0 | Digital Video Signal 16 |
| 43 | G_GND | Power Source | 0 | Gate Driver Circuit Negative Power Source |
| 44 | G_VDD | Power Source | 10 | Gate Driver Circuit Positive Power Source |
| 45 | G_UP | Power Source | 0.0 or 10.0 | Gate Driver Circuit Scanning Direction Selector (0.0: Down Scanning 9.0: Up Scanning) |
| 46 | G_CKb | Balance | 0.0/10.0 | Gate Driver Circuit Clock Inverted Signal |
| 47 | G_CK | Balance | 0.0/10.0 | Gate Driver Circuit Clock Signal |
| 48 | G_SP | Unbalance | 0.0/10.0 | Gate Driver Circuit Start pulse Signal |
| 49 | EL_ANOD | Power Source | 9 | EL Driver D.C. Power Source (Anode) |
| 50 | EL_CATH | Unbalance | approximately 4 (0.0~9.0)/9 | EL Driver D.C. Power Source (Cathode) |
|  |  | NC |  | Pad only |

Figure 11:
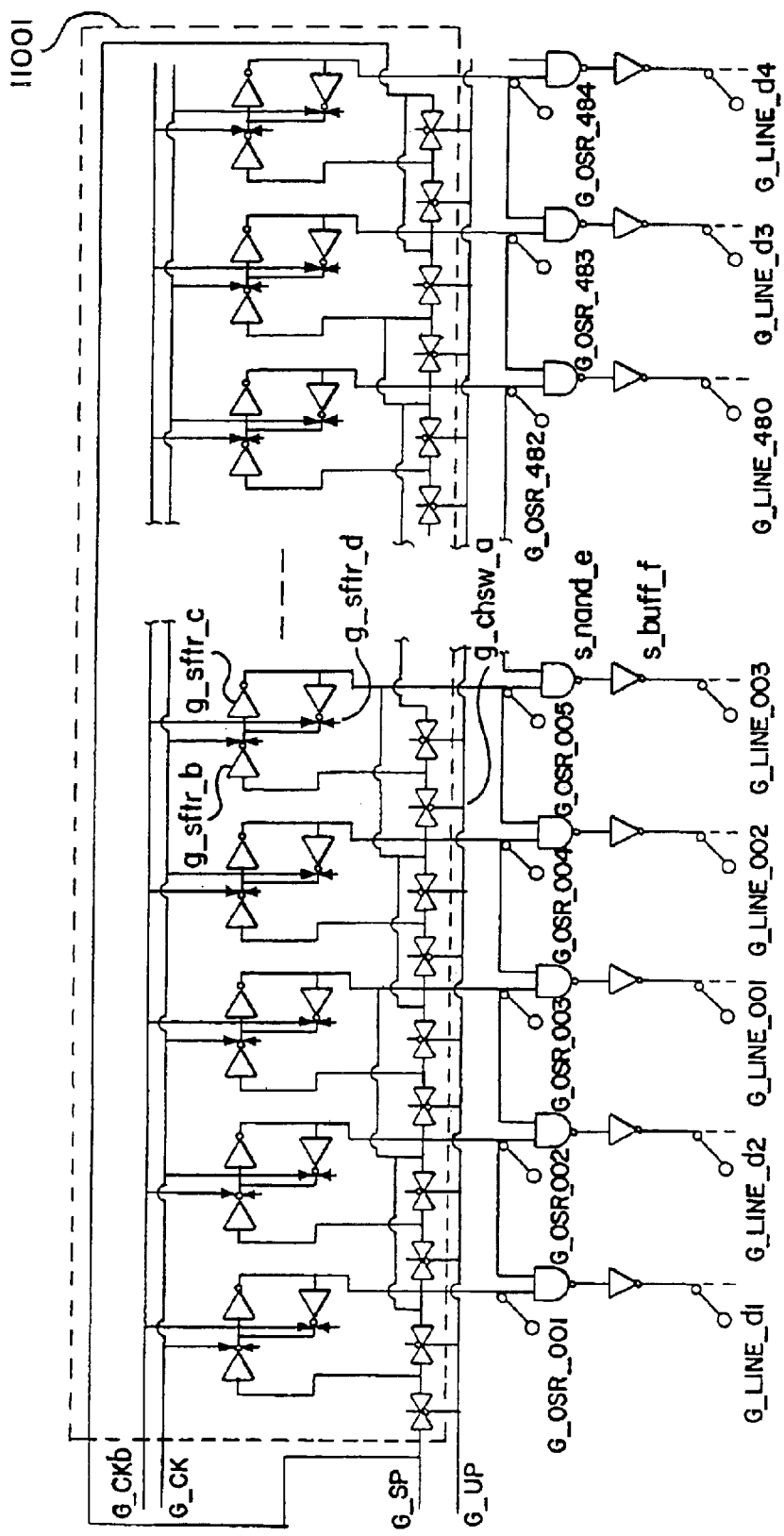
FIG. 11 is a diagram showing a gate driver circuit of an EL display device.

Next, FIG. 11 shows a detailed circuit diagram of the gate driver circuit 903 of FIG. 9. A positive electric power supply voltage in the gate driver circuit is 10 V, and a negative electric power supply voltage is 0 V. The operation clock frequency input to the gate driver circuit is 232 kHz. Further, the gate driver circuit has a function for switching between scanning directions.

Symbol g_chsw_a in FIG. 11 is a scanning direction switch, symbols g_sftr_b, g_sftr_c, and g_sftr_d are portions of a shift register, symbol g_nand_e is a NAND circuit, and symbol g_buff_f denotes a buffer.

A portion enclosed by a dashed line in FIG. 11, namely a portion composed of g_chsw_a, g_sftr_b, g_sftr_c, and g_sftr_d, is referred to as a shift register 11001 in embodiment 1.

The size of the TFTs contained in the shift register, the NAND circuit, the buffer structuring the gate driver circuit of embodiment 1 are shown in Table 2.

P-type TFTs and n-type TFTs are used in the shift register, the NAND circuit, and the buffer, and therefore values are shown for each of the TFTs. The sizes in Table 2 correspond to the symbols shown in FIG. 10. Further, symbol L (μm) in the table denotes the channel length of the TFT, and symbol W (μm) denotes the TFT channel width. Note that the Lov region is contained in the channel length of the n-type TFT.

TABLE 2

| Pch-TFT | L[μm] | W[μm] | Nch-TFT | L[μm] | Lov[μm] | W[μm] |
|---|---|---|---|---|---|---|
| g_chsw_a | 4.5 | 20 | g_chsw_a | 5 | 0.5 | 10 |
| g_sftr_b | 4.5 | 16 | g_sftr_b | 5 | 0.5 | 8 |
| g_sftr_c | 4.5 | 40 | g_sftr_c | 5 | 0.5 | 20 |
| g_sftr_d | 4.5 | 10 | g_sftr_d | 5 | 0.5 | 5 |
| g_nand_e | 4.5 | 22 | g_nand_e | 5 | 0.5 | 22 |
| g_buff_f | 4.5 | 50 | g_buff_f | 5 | 0.5 | 25 |

Figure 12A:
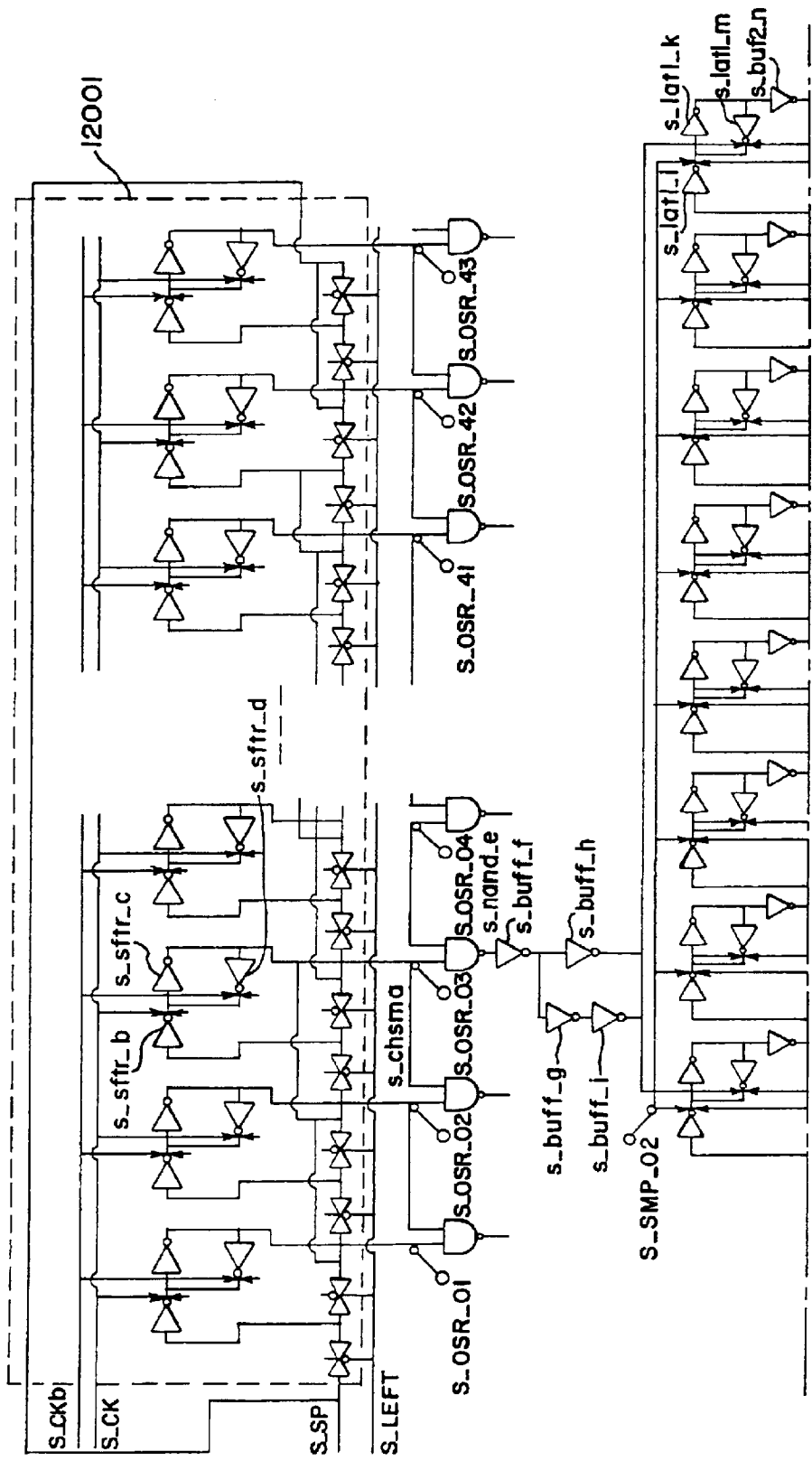
FIG. 12 is a diagram showing a source driver circuit of an EL display device.
Figure 12B:
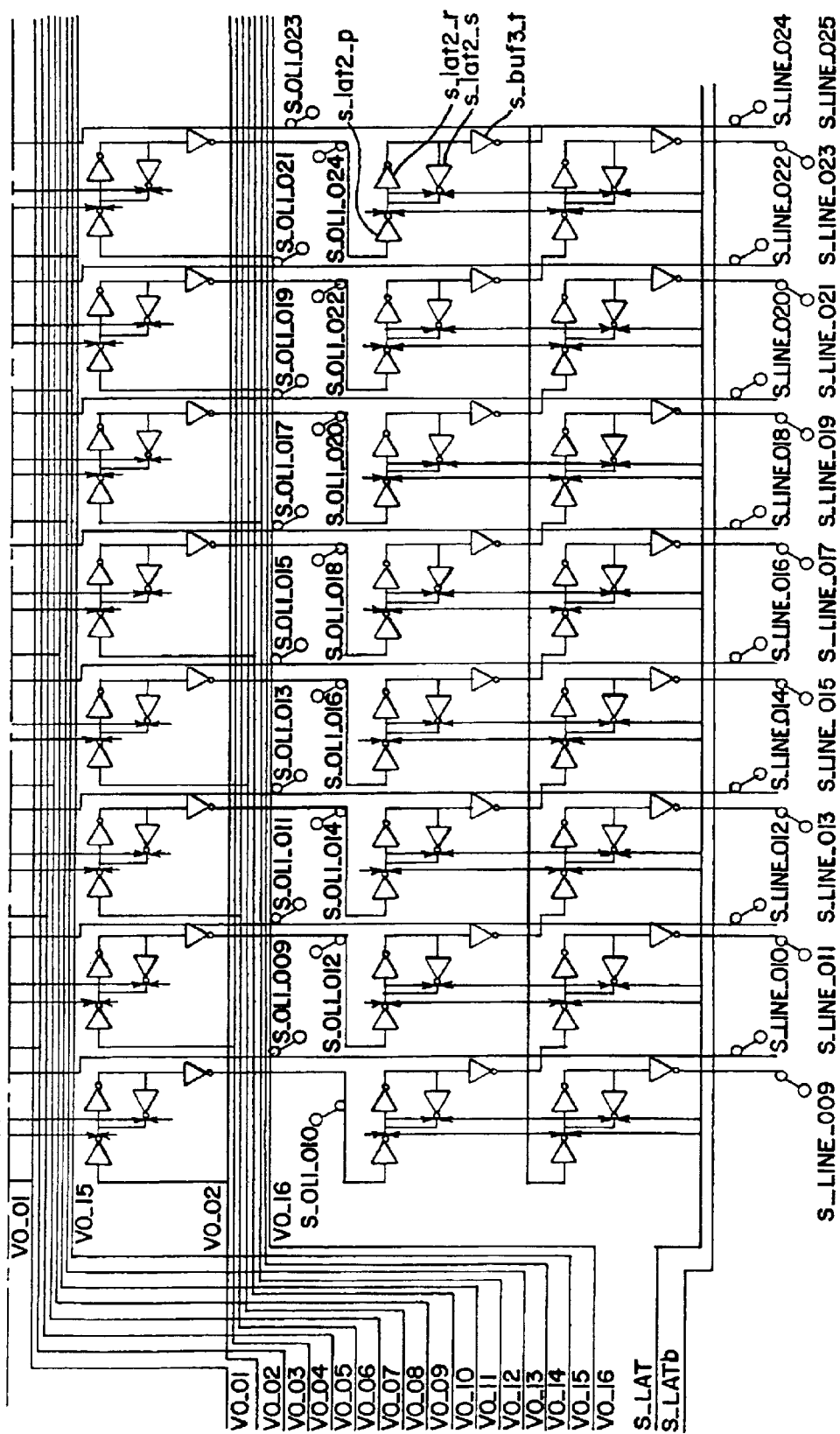

Next, a detailed circuit diagram of the source driver circuit 902 of FIG. 9 is shown in FIG. 12. A positive electric power supply voltage in the source driver circuit is 9 V, and a negative electric power supply voltage is 0 V. The operation clock frequency input to the source driver circuit is 12.5 MHz and the source driver circuit has a function for switching between scanning directions.

Symbol s_chsw_a in FIG. 12 is a scanning direction switch, symbols s_sftr_b, s_sftr_c, and s_sftr_d are portions of a shift register, symbol s_nand_e is a NAND circuit, and symbols s_buff_f, s_buff_g, S_buff_h, and s_buff_i all denote buffers. Further, symbols s_lat1_j, s_lat1_k, s_lat1_m, s_lat_n (hereinafter referred to as latch 1), and s_lat2_p, s_lat2_r, s_lat2_s are second row (hereinafter referred to as latch 2).

A portion enclosed by a dashed line in FIG. 12, namely a portion composed of s_chsw_a, s_sftr_b, s_sftr_c, and s_sftr_d, is referred to as a shift register 12001 in embodiment 1.

The size of the TFTs contained in the shift register, the NAND circuit, the buffer structuring the source driver circuit of embodiment 1 are next shown in Table 3. P-type TFTs and n-type TFTs are used in the shift register, the NAND circuit, and the buffer, and therefore values are shown for each of the TFTs. The sizes in Table 3 correspond to each of the symbols shown in FIG. 12. Further, symbol L (μm) in the table denotes the channel length of the TFT, and symbol W (μm) denotes the TFT channel width. Note that the Lov region is contained in the channel length of the n-type TFT.

TABLE 3

| Pch-TFT | L[μm] | W[μm] | Nch-TFT | L[μm] | Lov[μm] | W[μm] |
|---|---|---|---|---|---|---|
| s_chsw_a | 4.5 | 60 | s_chsw_a | 5 | 0.5 | 40 |
| s_sftr_b | 4.5 | 50 | s_sftr_b | 5 | 0.5 | 25 |
| s_sftr_c | 4.5 | 100 | s_sftr_c | 5 | 0.5 | 50 |
| s_sftr_d | 4.5 | 30 | s_sftr_d | 5 | 0.5 | 15 |
| s_nand_e | 4.5 | 50 | s_nand_e | 5 | 0.5 | 50 |
| s_buf1_f | 4.5 | 100 | s_buf1_f | 5 | 0.5 | 50 |
| s_buf1_g | 4.5 | 100 | s_buf1_g | 5 | 0.5 | 50 |
| s_buf1_h | 4.5 | 300 | s_buf1_h | 5 | 0.5 | 150 |
| s_buf1_i | 4.5 | 400 | s_buf1_i | 5 | 0.5 | 200 |
| s_lat1_j | 4.5 | 16 | s_lat1_j | 5 | 0.5 | 8 |
| s_lat1_k | 4.5 | 16 | s_lat1_k | 5 | 0.5 | 8 |
| s_lat1_m | 4.5 | 4 | s_lat1_m | 5 | 0.5 | 2 |
| s_buf2_n | 4.5 | 30 | s_buf2_n | 5 | 0.5 | 15 |
| s_lat2_p | 4.5 | 16 | s_lat2_p | 5 | 0.5 | 8 |
| s_lat2_r | 4.5 | 16 | s_lat2_r | 5 | 0.5 | 8 |
| s_lat2_s | 4.5 | 4 | s_lat2_s | 5 | 0.5 | 2 |
| s_buf3_t | 4.5 | 30 | s_buf3_t | 5 | 0.5 | 15 |

Figure 13:
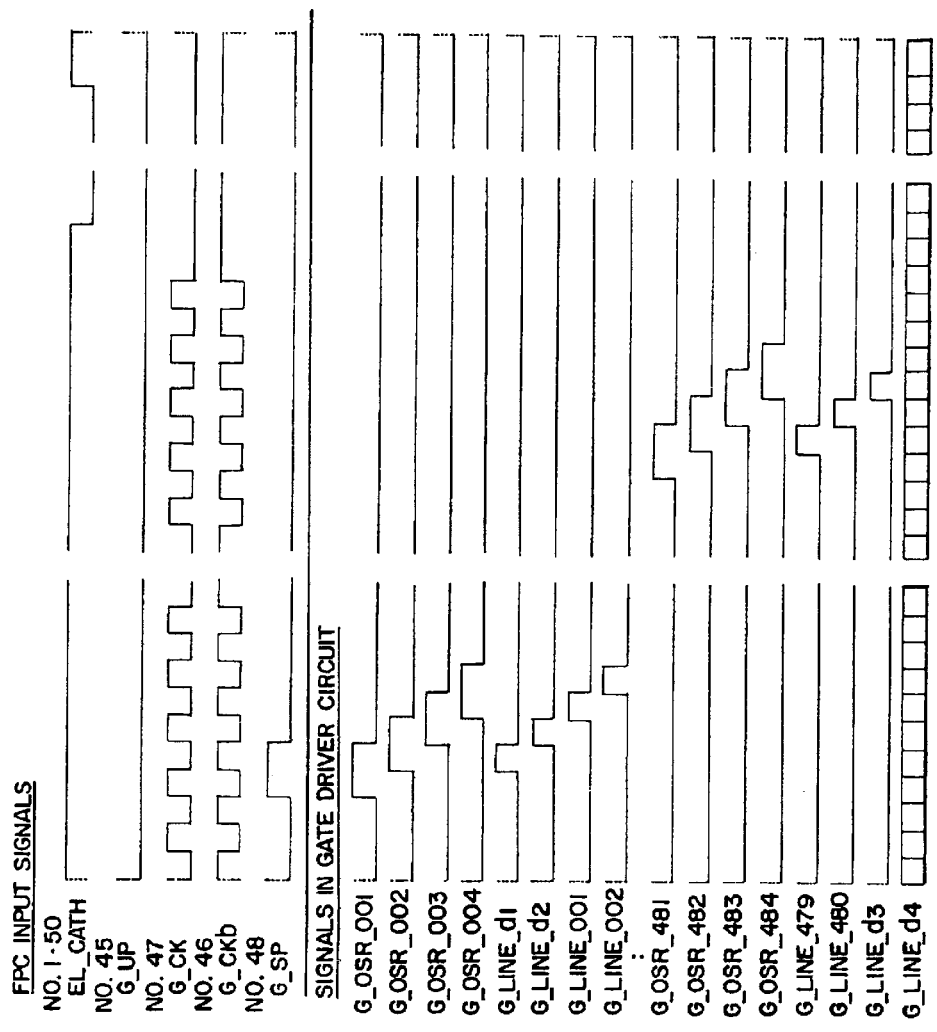
FIG. 13 is a timing diagram of an input signal from a source driver circuit side of an EL display device.
Figure 14:
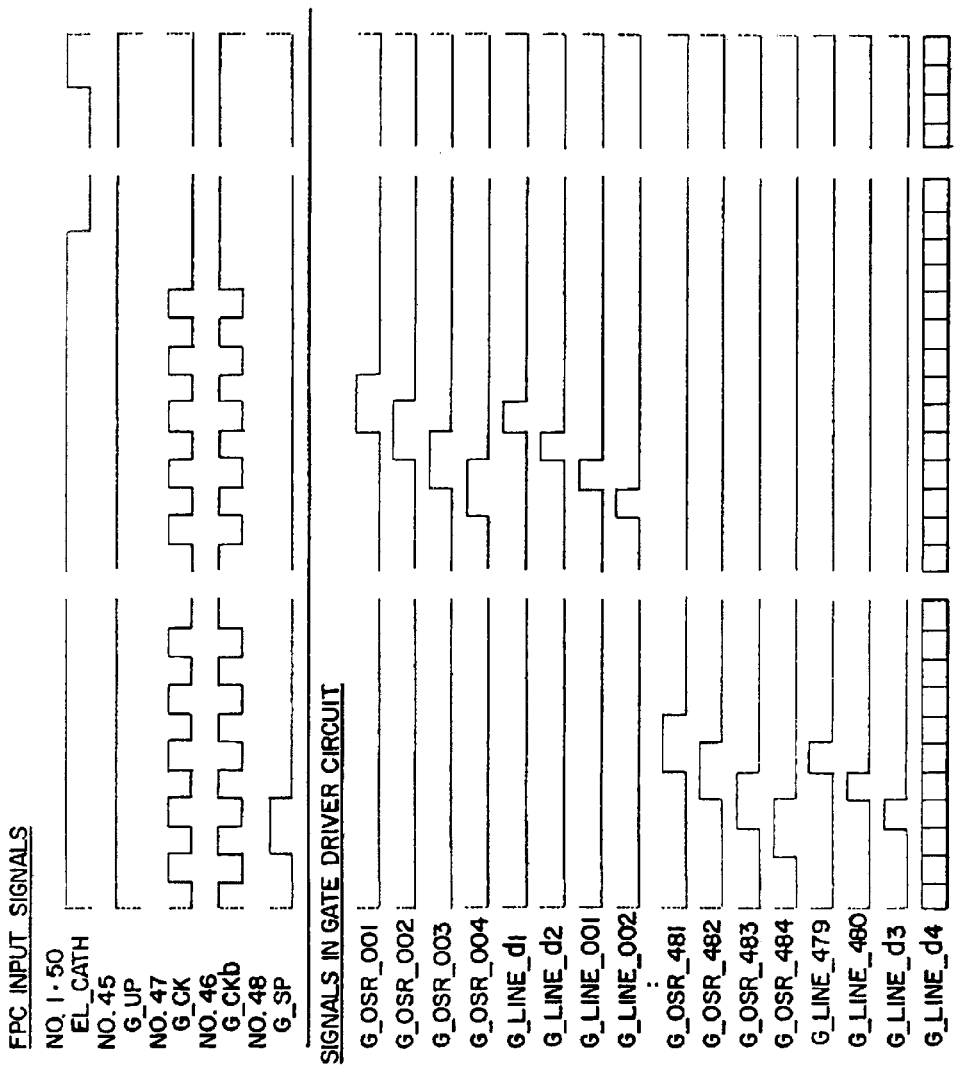
FIG. 14 is a timing diagram of an input signal from a source driver circuit side of an EL display device.

Timing charts for signals input from the gate driver circuit are shown in FIG. 13 and FIG. 14. FIG. 13 is for a case in which the gate line selection is in the downward scanning direction, and FIG. 14 is for a case of the upward scanning direction. Note that this is shown with a unit of one field.

A signal input from the FPC and a signal input from the gate driver circuit are shown in FIG. 13 and FIG. 14. In the signal input from the FPC, symbol EL_CATH is a dc power supply for driving the EL, symbol G_UP is a signal for switching the scanning direction of the gate driver circuit, symbol G_CK is a clock signal input to the gate driver circuit, symbol G_CKb is an inverted clock signal input to the gate driver circuit, and symbol G_SP denotes a start pulse signal input to the gate driver circuit.

Furthermore, in the signal input from the gate driver circuit, symbols such as G_OSR_001 denote a signal output from the shift registers, and symbols such as G_LINE_001 denote a signal input to the gate lines.

The symbols shown in FIG. 13 and FIG. 14 correspond to the symbols shown in FIG. 11.

Next, timing charts for signals input from the source driver circuit are shown in FIG. 15 and FIG. 16. Both are for horizontal direction scanning, and FIG. 15 is for a case of writing into m columns of pixels by scanning in the right direction, while FIG. 16 is for a case of writing into m columns of pixels by scanning in the left direction.

A signal input from the FPC and a signal input from the gate driver circuit and the source driver circuit are shown in FIG. 15 and FIG. 16. In the signal input from the FPC, symbol S_LAT is a latch signal input to the source driver circuit, symbol S_LATb is an inverted latch signal input to the source driver circuit, symbol S_LEFT is a signal for switching the scanning direction of the source driver circuit, symbol S_CK is a clock signal input to the source signal circuit, symbol S_CKb is an inverted clock signal input to the source driver circuit, symbol S_SP is a start pulse signal input to the source driver circuit, and symbols such as VD_01 denote a video signal input to the source driver circuit from the first (number 01) of 16 video lines.

Furthermore, in the signal input from the source driver circuit, symbols such as S_OSR_001 denote a signal output from the shift registers to the source line, and symbols such as S_OL1_01 denote a signal output from the latch 1 connected to the first (number 001) source line. Symbols such as S_SMP_01 denote a signal output from the sampling circuit connected to the first (number 01) source line. Symbols such as G_LINE_m denote a signal input to the number m gate line.

The symbols shown in FIG. 15 and FIG. 16 correspond to the symbols shown in FIG. 12.

Figure 7:
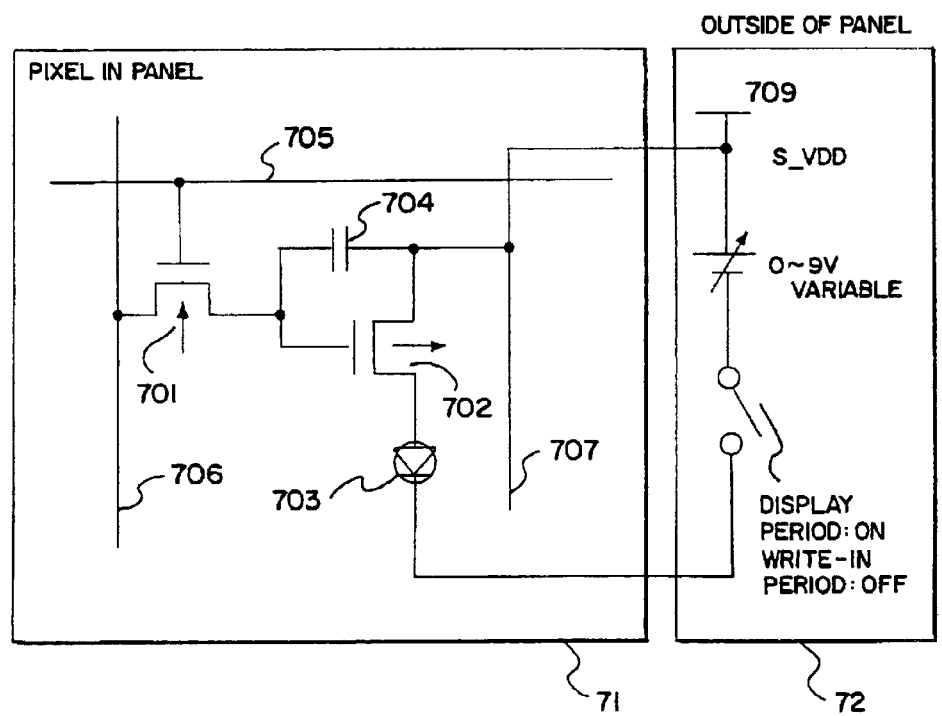
FIG. 7 is a diagram showing a pixel structure of a pixel portion of an EL display device.
Figure 8:
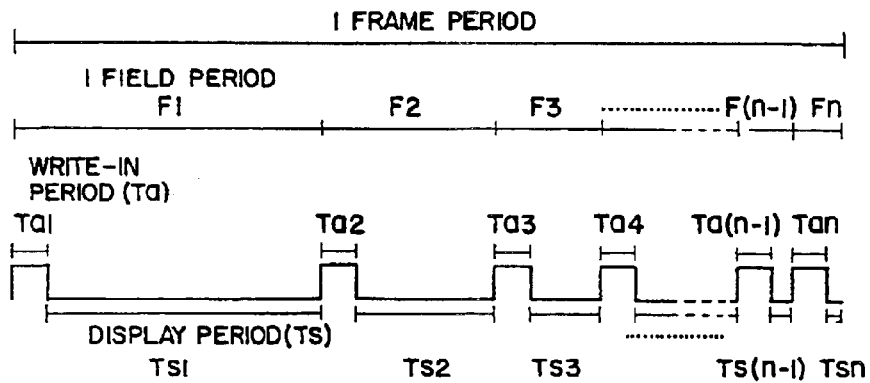
FIG. 8 is a diagram for explaining an operating mode of a time division gradation method.

Each pixel inside the panel in embodiment 1 has a structure like that of reference numeral 71 of FIG. 7. The EL driver TFT 702 is p-type (L=5 μm, W=2 μm), and the pixel switch TFT 701 is n-type (L=2.5 T (excluding Loff=0.5×2× 3), W=1 μm). Further, the surface area of the supplemental capacitor 704 is S=from 0.05 to 0.11 mm$^2$.

The specifications of a display panel in embodiment 1 are shown in Table 4.

TABLE 4

| | |
|---|---|
| Screen Size | 0.7 inch (diagonal) |
| Number of Pixels | 640 × 480 |
| Pixel Space | 22.5 μm |
| Gradation | 64 (6 bit) |
| Aperture Ratio | 38% |
| Operating Clock frequency in Source Driver Circuit | 12.5 MHz |
| Operating Clock frequency in Gate Driver Circuit | 232 kHz |

TABLE 4-continued

| | |
|---|---|
| Voltage in Driver Circuit | 9 V |
| Voltage in Display Portion | 7 V |
| Duty Ratio | 62.5% |
| Color | Single Color | the panel size in embodiment 1 is 50 mm×50 mm, and the screen size is 14.4 mm×10.8 mm (0.7 inch diagonal). The pixel size is 12.5 μm×12.5 μm, the pixel matrix has a striped shape, and the aperture ratio is approximately 38%.

Further, the number of pixels per one screen is calculated by (d2+640+d2)×(d2+480+d2), which equals 307,200+(d) 4496 pixels (where d refers to a dummy).

The panel specifications in embodiment 1 are a 640×480 VGA, and a single color display. Further, there are 64 gradations (6 bits), and the duty ratio is 62.5%.

Figure 26:
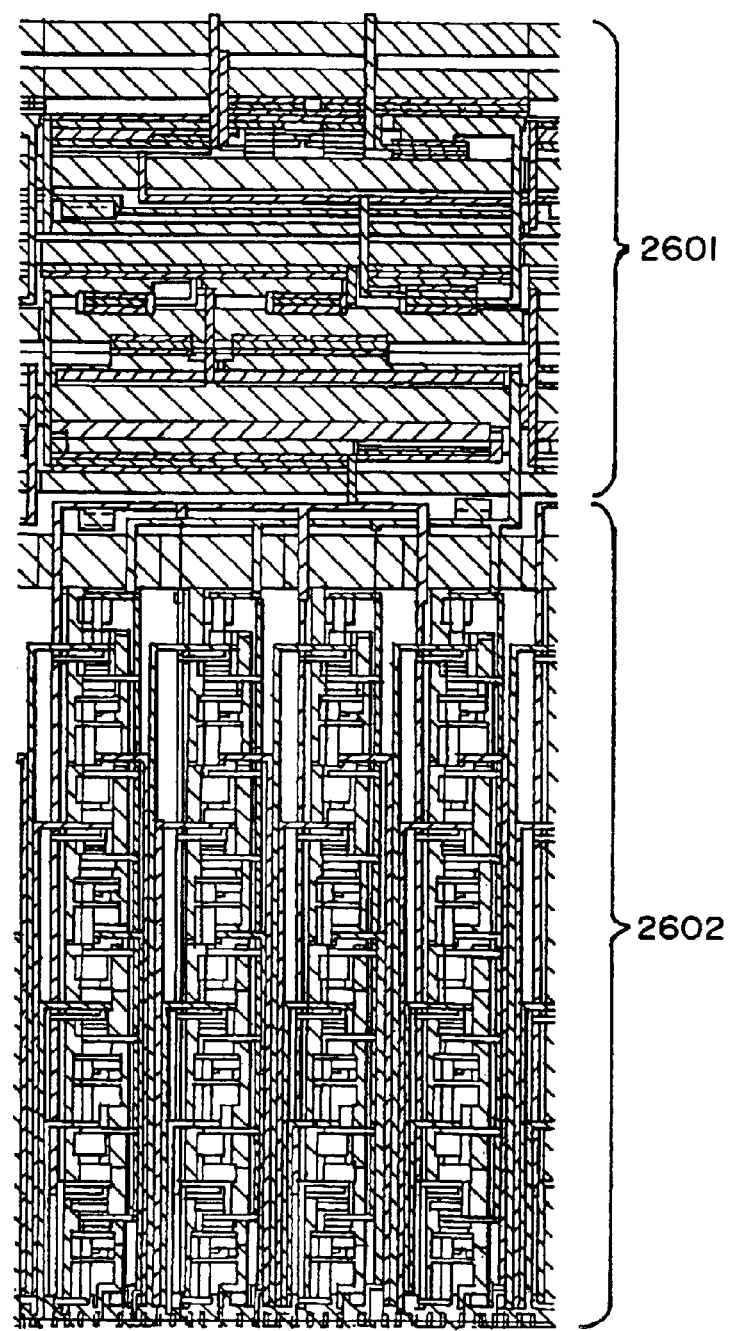
FIG. 26 is a diagram showing a portion of a source driver circuit of an EL display device.

A portion of the source driver circuit in embodiment 1 is shown in FIG. 26. Reference numeral 2601 in the figure denotes a shift register, and reference numeral 2602 denotes a latch (1).

Figure 27A:
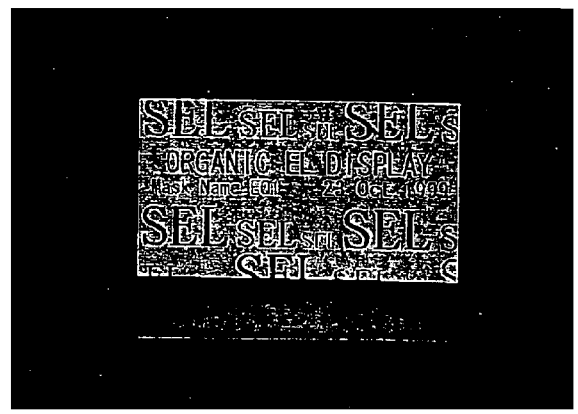
FIGS. 27A and 27B are photographs showing an image of an EL display device which uses the present invention.
Figure 27B:
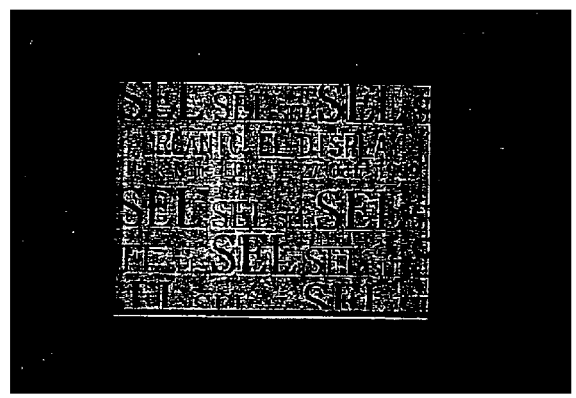

In addition, a photograph of a static image display of the EL display device obtained by implementing the present invention is shown in FIG. 27.

Embodiment 2

A switch (reference numeral 709 of FIG. 7) of a power supply for applying a voltage to an EL element formed externally to the panel is turned off during a display period, and the power supply switch is turned on during a write-in period in embodiment 1. If this method is used, it becomes a system in which the electric power supply switch is turned on at the same time as the display period is entered, after the write-in period is finished. In this case a large, sudden increase in the amount of electric current develops at the same time as the display period is entered, and therefore the electric charge charging capability of a variable electric power supply with respect to the load of the entire panel is exceeded.

The voltage required by the entire panel thus cannot be applied, and a sufficient panel display cannot be performed.

In embodiment 2, the sudden increase in electric current between the write-in period and the display period can be prevented by always leaving the switch of the electric power supply (reference numeral 709 of FIG. 7) turned on.

Figure 4A:
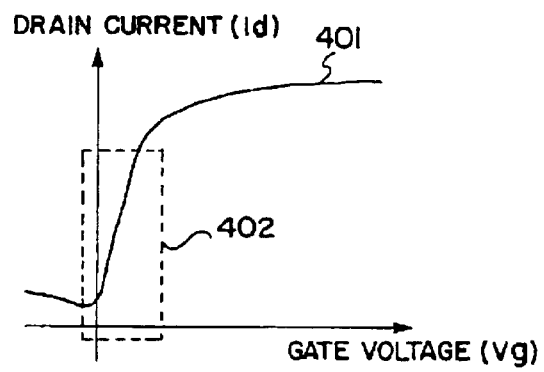
FIGS. 4A and 4B are diagrams for explaining the TFT characteristics utilized by an analog gradation method.
Figure 4B:
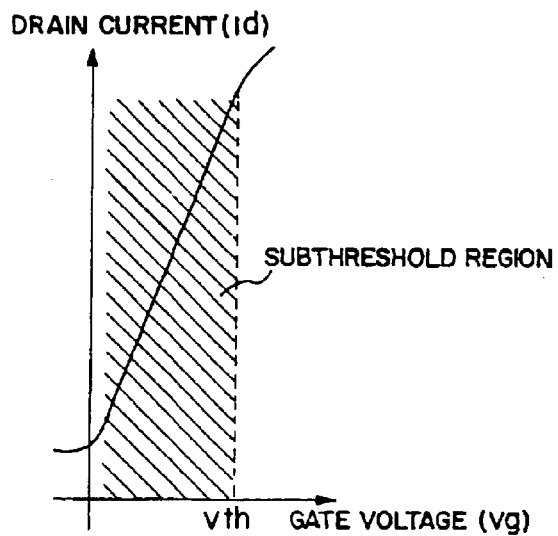
Figure 6:
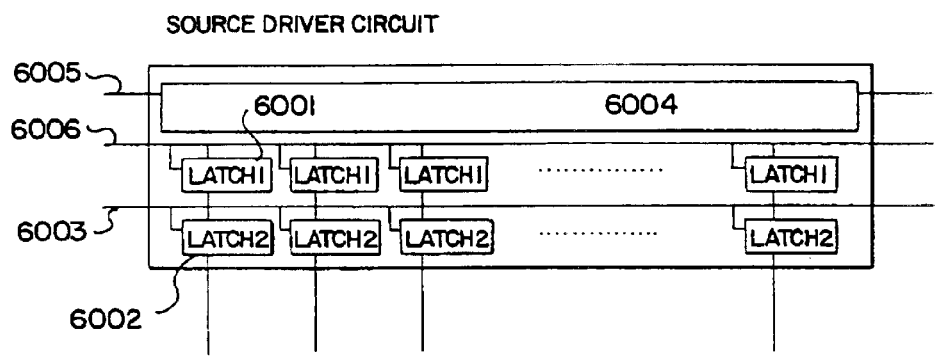
FIG. 6 is a diagram showing a source driver circuit of an EL display device.

However, display is performed during the write-in period as well when using this method, and when the display period is shorter than the write-in period, such as in the write-in 4, the write-in 5, and the write-in 6 in FIG. 4C, it effectively becomes impossible to implement the display 4, the display 5, and the display 6.

In other words, when implementing embodiment 2, it is considered that the following points are necessary: 1) the number of pixels is reduced and the write-in period is shortened; 2) the performance of the TFTs contained in the driver circuits is increased and the operation speed is increased; and 3) using a structure in which the driver circuits are attached external to the panel, increasing the operating speed.

Embodiment 3

An embodiment of the present invention will be described referring to FIGS. 17 to 20. A method of simultaneously manufacturing TFTs of a pixel portion and a driver circuit portion provided in the periphery of the pixel portion will be described herein. Concerning the driver circuit, a CMOS circuit that is a base unit is shown in the figure, for a brief description.

Figure 17A:
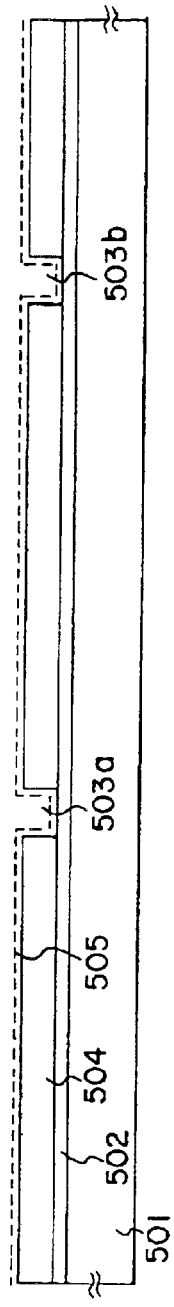
FIGS. 17A to 17E are diagrams showing a process of manufacturing an EL display device.

First, a substrate 501 in which a base film (not shown) is disposed on the surface thereof is prepared as shown in FIG. 17(A). In this embodiment, a silicon nitride oxide film having a thickness of 100 nm and another silicon nitride oxide film having a thickness of 200 nm are laminated as a base film on a crystallized glass. At this time, preferably, the concentration of nitrogen of the film contacting the crystallized glass substrate is kept to 10–25 wt %. It is possible to form an element directly on the quartz substrate without forming any base film, of course.

Thereafter, an amorphous silicon film 502 whose thickness is 45 nm is formed on the substrate 501 by a well-known film formation method. There is no need to limit it to the amorphous silicon film. Instead, a semiconductor film (including a micro-crystal semiconductor film) that has an amorphous structure can be used in this embodiment. A compound semiconductor film that has an amorphous structure, such as an amorphous silicon germanium film, also can be used herein.

Figure 17B:
Figure 17C:
Figure 17D:
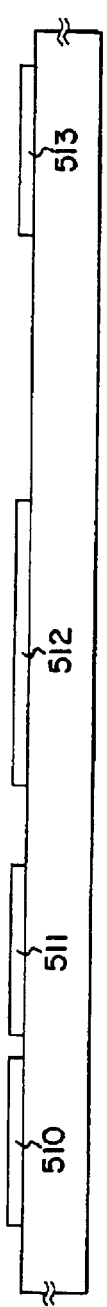

Concerning the steps from here to FIG. 17(C), it is possible to completely cite Japanese Laid-open Patent Publication No. 10-247735 filed by the present applicant. This publication discloses a technique concerning a method of crystallizing a semiconductor film, which uses an element, such as Ni, as a catalyst.

First, a protecting film 504 that has openings 503a and 503b is formed. A silicon oxide film having 150 nm thick is used in this embodiment. A layer 505 that contains nickel (Ni containing layer) is formed on the protecting film 504 by a spin coating method.

Concerning the formation of the Ni containing layer, reference can be made to the above publication.

Thereafter, as shown in FIG. 17(B), heating processing at 570° C. for 14 hours is performed in an inert atmosphere, and the amorphous silicon film 502 is crystallized. At this time, crystallization progresses schematically in parallel with the substrate, starting from regions 506a and 506b (hereinafter, designated as Ni addition region) with which Ni is in contact. As a result, a polysilicon film 507 that has a crystal structure in which rod-like crystals gather and form lines is formed. According to the electron beam diffraction photographs, the applicant of the present invention found that the diffraction spot appeared in correspondence to the {110} face as shown in FIG. 12(A) was observed.

Thereafter, as shown in FIG. 17(C), an element (phosphorus preferably) that belongs to 15-group is added to the Ni addition regions 506a and 506b, while leaving the protecting film 504 as a mask. Regions 508a and 508b (hereinafter, designated as phosphorus addition region) to which phosphorus was added at high concentration are thus formed.

Thereafter, heat processing at 600° C. for 12 hours is performed in an inert atmosphere as shown in FIG. 17(C). Ni existing in the polysilicon film 507 is moved by this heat processing, and almost all of them are finally captured by the phosphorus addition regions 508a and 508b as shown by the arrow. It is thought that this is a phenomenon caused by the gettering effect of a metallic element (Ni in this embodiment) by phosphorus.

By this process, the concentration of Ni remaining in the polysilicon film 509 is reduced to at least $2\times10^{17}$ atoms/cm$^3$ according to the measurement value by SIMS (secondary ion-mass spectrometry). Although Ni is a lifetime killer for a semiconductor, no adverse influence is given to the TFT characteristic when it is decreased to this extent. Additionally, since this concentration is the measurement limit of the SIMS analysis in the current state of the art, it will show an even lower concentration ($2\times10^{17}$ atoms/cm$^3$ or lower) in practice.

The polysilicon film 509 can be thus obtained that is crystallized by a catalyst and is decreased to the level in which the catalyst does not obstruct the operation of a TFT. Thereafter, active layers 510–513 that use the polysilicon film 509 only are formed by a patterning process. At this time, a marker to conduct mask alignment in the following patterning should be formed by using the above polysilicon film. (FIG. 17(D))

Figure 17E:

Then, a silicon nitride oxide film having 50 nm thick is formed by the plasma CVD method as shown in FIG. 17(E), heating processing at 950° C. for 1 hour is then performed in an oxidation atmosphere, and a thermal oxidation process is performed. Note that the oxidation atmosphere can be an oxygen atmosphere or another oxygen atmosphere in which halogen is added.

In this thermal oxidation process, the oxidation progresses in the interface between the active layer and the silicon nitride oxide film, and a polysilicon film having a thickness of about 15 nm is oxidized, so that a silicon oxide film having a thickness of about 30 nm is formed. That is, a gate insulating film 514 with 80 nm thick is formed in which the silicon oxide film 30 nm thick and the silicon nitride oxide film 50 nm thick are laminated. The film thickness of the active layers 510–513 is made 30 nm by the thermal oxidation process.

Figure 18A:
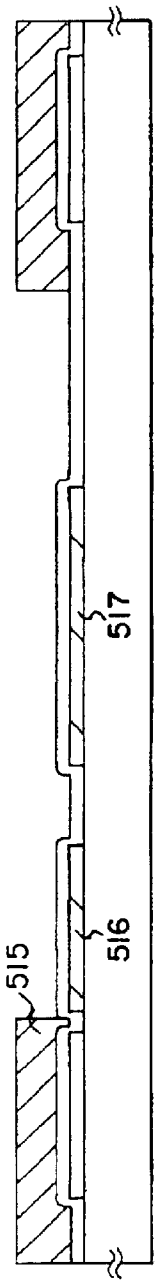
FIGS. 18A to 18D are diagrams showing the process of manufacturing the EL display device.

Then, as shown in FIG. 18(A), a resist masks 515a and 515b are formed, and an impurity element (hereinafter, designated as p-type impurity element) that gives the p-type through the gate insulating film 514 is added. As the p-type impurity element, an element that belongs to 13-group representatively, boron or gallium typically, can be used. This (called a channel dope process) is a process for controlling the threshold voltage of a TFT.

In this embodiment, boron is added by the ion dope method in which plasma excitation is performed without the mass separation of diborane ($B_2H_6$). The ion implantation method that performs the mass separation can be used, of course. According to this process, impurity regions 516 to 518 are formed that include boron at the concentration of $1\times10^{15}$ to $1\times10^{18}$ atoms/cm³ ($5\times10^{16}$ to $5\times10^{17}$ atoms/cm³ representatively).

Figure 18B:
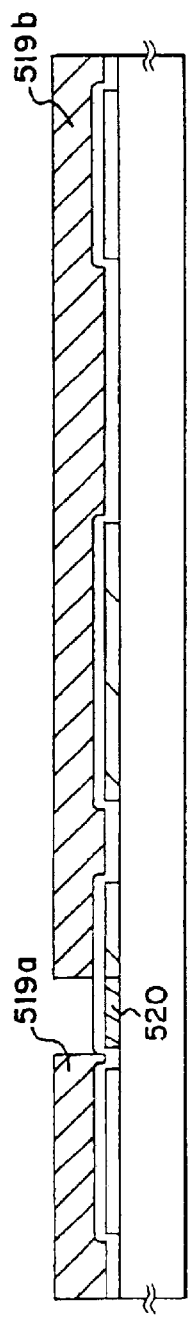

Thereafter, resist masks 519a and 519b are formed as shown in FIG. 18(B), and an impurity element (hereinafter, designated as an n-type impurity element) that gives the n-type through the gate insulating film 514 is added. As the n-type impurity element, an element that belongs to 15-group representatively, phosphorus or arsenic typically, can be used. In this embodiment, a plasma doping method in which plasma excitation is performed without the mass separation of phosphine ($PH_3$) is used. Phosphorus is added in the concentration of $1\times10^{18}$ atoms/cm³. The ion implantation method that performs mass separation can be used, of course.

A dose amount is adjusted so that the n-type impurity element is included in the n-type impurity region 520 formed by this process at the concentration of $2\times10^{16}$–$5\times10^{19}$ atoms/cm³ ($5\times10^{17}$–$5\times10^{18}$ atoms/cm³ representatively).

Figure 18C:
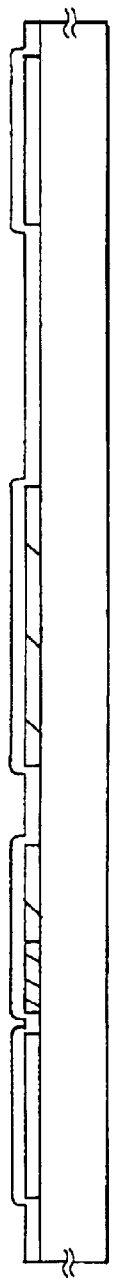
Figure 18D:
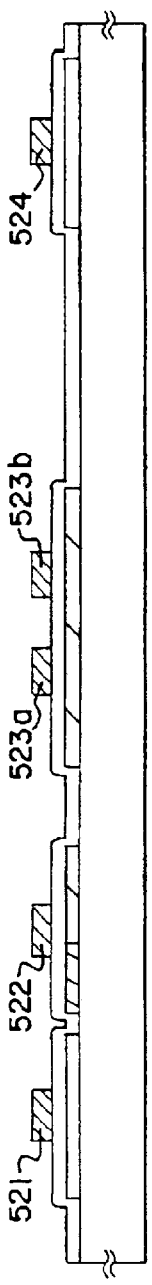

Thereafter, a process is performed for activating the added n-type impurity element and the added p-type impurity element as shown in FIG. 18(C). There is no need to limit the activation means, but, since the gate insulating film 514 is disposed, the furnace annealing process that uses an electro-thermal furnace is desirable. Additionally, it is preferable to perform heat processing at a temperature as high as possible because there is a possibility of having damaged the interface between the active layer and the gate insulating film of a part that is a channel formation region in the process of FIG. 18(A).

Since the crystallized glass with high heat resistance is used in this embodiment, the activating process is performed by the furnace annealing processing at 800° C. for 1 hour. The thermal oxidation can be performed keeping a processing atmosphere in an oxidizing atmosphere, or the heat processing can be performed in an inert atmosphere.

This process clarifies the edge of the n-type impurity region 520, namely, the boundary (junction) between the n-type impurity region 520 and the region (p-type impurity region formed by the process of FIG. 18(A)) around the n-type impurity region 520, where the n-type impurity element is not added. This means that the LDD region and the channel formation region can form an excellent junction when a TFT is later completed.

Thereafter, a conductive film having 200–400 nm thick is formed, and patterning is performed to form gate electrodes 521–524. Note that the gate electrode can be made of a conductive film of a single-layer preferably, a lamination film, such as two-layer or three-layer film, is used when necessary. As a material for a gate electrode, a known conductive film can be used.

Specifically, a film made of an element selected from the group of consisting of tantalum (Ta), titanium (Ti), molybdenum (Mo), tungsten (W), chrome (Cr), aluminum (Al), copper (Cu), silver (Ag) and silicon (Si) having conductivity; a film made of a nitride of the aforementioned elements (tantalum nitride film, tungsten nitride film, or titanium nitride film representatively); an alloy film of a combination of the aforementioned elements (Mo—W alloy or Mo—Ta alloy representatively); or, a silicide film of the aforementioned elements (tungsten silicide film or titanium silicide film representatively). Of course, a single-layer structure or a lamination-layer structure may be used.

In this embodiment, a lamination film is used that is made of a tungsten nitride (WN) film having 50 nm thick and a tungsten (W) film having 350 nm thick. This can be formed by the sputtering method. By adding an inert gas, such as Xe or Ne, as a spattering gas, the film can be prevented from peeling off due to stress.

At this time, the gate electrode 522 are formed to overlap with part of the n-type impurity region 520 with the gate insulating film 514 therebetween. The overlapping part is later made an LDD region overlapping with the gate electrode. According to the sectional view of the figure, the gate electrodes 523a and 523b are seen as separate, in fact, they are connected electrically to each other.

Figure 19A:
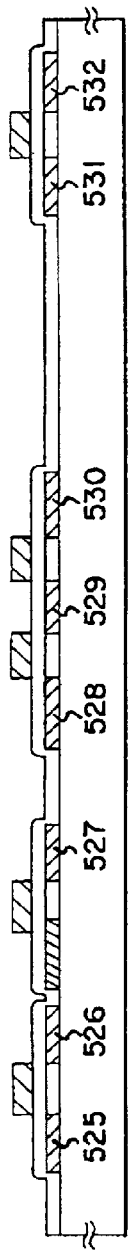
FIGS. 19A to 19D are diagrams showing the process of manufacturing the EL display device.

Thereafter, with the gate electrodes 521–524 as masks, an n-type impurity element (phosphorus in this embodiment) is added in a self-alignment manner, as shown in FIG. 19(A). At this time, an adjustment is performed so that phosphorus is added to the thus formed impurity regions 525-532 at the concentration of the n-type impurity region 520. Specifically, it is preferable that the concentration is $1\times10^{16}$–$5\times10^{18}$ atoms/cm³ ($3\times10^{17}$–$3\times10^{18}$ atoms/cm³ typically).

Figure 19B:
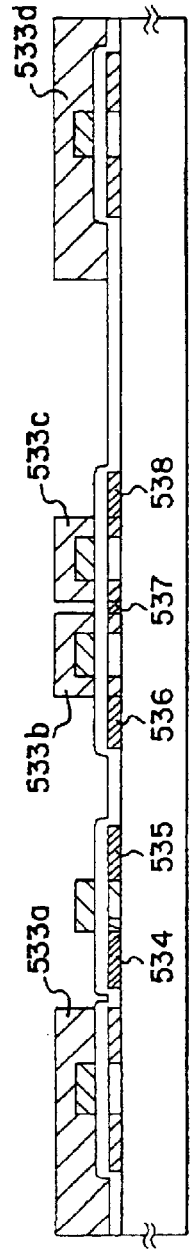

Thereafter, as shown in FIG. 19(B), resist masks 533a–533d are formed to cover the gate electrode, an n-type impurity element (phosphorus in this embodiment) is then added, and impurity regions 534–538 including a high concentration of phosphorus are formed. The ion dope method using phosphine ($PH_3$) is applied also herein, and an adjustment is performed in order that the concentration of phosphorus in these regions is $1\times10^{20}$–$1\times10^{21}$ atoms/cm³ ($2\times10^{20}$–$5\times10^{20}$ atoms/cm³ representatively).

A source region or a drain region of the n-channel type TFT is formed through this process, and the switching TFT leaves a part of the n-type impurity regions 528–530 formed in the process of FIG. 19(A). The left region corresponds to the LDD regions 15a to 15d of the switching TFT in FIG. 2.

Figure 19C:
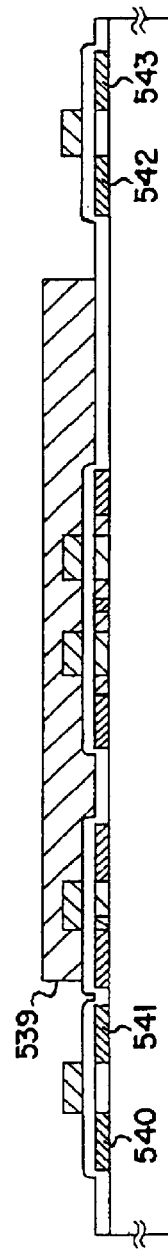

Thereafter, as shown in FIG. 19(C), the resist masks 533a–533d are removed, and a resist mask 539 is newly formed. A p-type impurity element (boron in this embodiment) is then added, and impurity regions 540 to 543 including a high concentration of boron are formed. Herein, according to the ion dope method using diborane ($B_2H_6$), boron is added to obtain a concentration of $3\times10^{20}$–$3\times10^{21}$ atoms/cm$^3$ ($5\times10^{20}$–$1\times10^{21}$ atoms/cm$^3$ representatively).

Phosphorus has been already added to the impurity regions 540 to 543 at a concentration of $1\times10^{20}$–$1\times10^{21}$ atoms/cm$^3$. Boron added herein has at least three times as high concentration as the added phosphorus. Therefore, the impurity region of the n-type formed beforehand is completely changed into that of the p-type, and functions as an impurity region of the p-type.

Figure 19D:
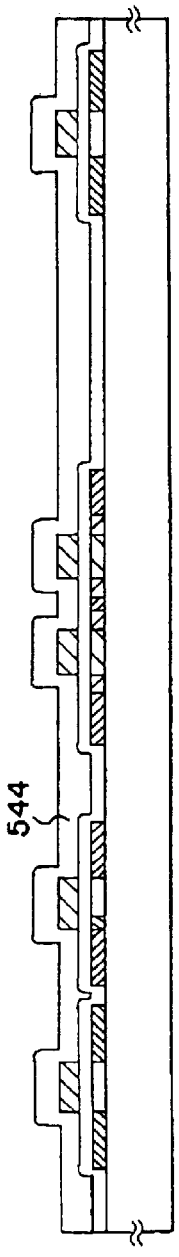

Thereafter, as shown in FIG. 19(D), the resist mask 539 is removed, and then a first interlayer insulating film 544 is formed. As the first interlayer insulating film 544, an insulating film that includes silicon is used in the form of a single-layer structure or a laminate structure as a combination thereof. The film thickness thereof can be 400 nm–1.5 µm. In this embodiment, a structure is created in which a silicon oxide film having a 800 nm thick is stacked on a silicon nitride oxide film having a 200 nm thick.

Thereafter, the n-type or p-type impurity element added at each concentration is activated. The furnace annealing method is desirable as an activation means. In this embodiment, heat treatment is performed at 550° C. for 4 hours in a nitrogen atmosphere in an electro-thermal furnace.

Heat treatment is further performed at 300–450° C. for 1–12 hours in an atmosphere that includes hydrogen of 3–100% for hydrogenation. This is a process to hydrogen-terminate a dangling bond of a semiconductor film by thermally excited hydrogen. As another means for hydrogenation, plasma hydrogenation (hydrogen excited by plasma is used) can be performed.

Hydrogenation can be performed during the formation of the first interlayer insulating film 544. In more detail, after the 200 nm-thick silicon nitride oxide film is formed, hydrogenation is performed as mentioned above, and thereafter the remaining 800 nm-thick silicon oxide film can be formed.

Figure 20A:
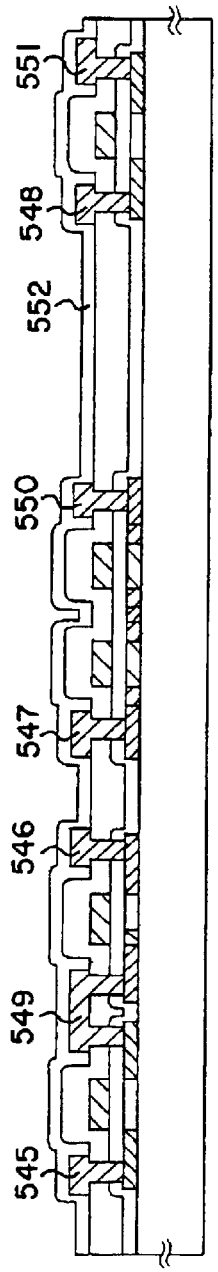
FIGS. 20A to 20C are diagrams showing the process of manufacturing the EL display device.

Thereafter, as shown in FIG. 20(A), contact holes are made in the first interlayer insulating film 544 and a gate, and source wirings 545-548 and drain wirings 549-551 are formed. In this embodiment, this electrode is formed with a lamination film of a three-layer structure in which a 100 nm-thick Ti film, a 300 nm-thick aluminum film that includes Ti, and a 150 nm-thick Ti film are continuously formed according to the sputtering method. Other conductive films can be used, of course.

Then, a first passivation film 552 is formed to be 50–500 nm thick (200–300 nm thick representatively). In this embodiment, a silicon nitride oxide film having a thickness of 300 nm is used as the first passivation film 552. A silicon nitride film can be substituted for this.

At this time, it is effective to perform plasma treatment by the use of gas that includes hydrogen, such as $H_2$ or $NH_3$, prior to the formation of the silicon nitride oxide film. Hydrogen excited by this pre-process is supplied to the first interlayer insulating film 544, and, through heat treatment, the film quality of the first passivation film 552 is improved.

At the same time, since hydrogen that is added to the first interlayer insulating film 544 diffuses onto the lower side, the active layer can be effectively hydrogenated.

Figure 20B:
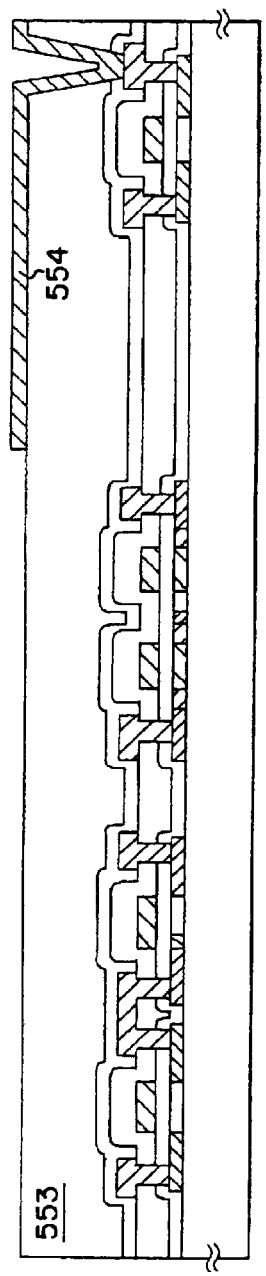

Thereafter, as shown in FIG. 20(B), a second interlayer insulating film 553 made of organic resin is formed. Polyimide, acrylic fiber, or BCB (benzocyclobutene) can be used as the organic resin. Especially, since the second interlayer insulating film 553 is required to flatten the level differences formed by TFTs, an acrylic film which is excellent in smoothness is desirable. An acrylic film is formed to be 2.5 µm thick in this embodiment.

Thereafter, contact holes that reach the drain wiring 551 are made in the second interlayer insulating film 553 and the first passivation film 552, and a pixel electrode(anode) 554 is formed. In the embodiment, an indium tin oxide (ITO) film is formed at a thickness of 110 nm and patterning is performed to form a pixel electrode. Instead of this, a transparent conductive film in which an oxide indium is mixed with zinc oxide (ZnO) at 2 to 20% may be used. The pixel electrode becomes an anode of an EL element.

Then, an insulating film (a silicon oxide film in this embodiment) that includes silicon is formed to be 500 nm thick, an opening is then formed at the position corresponding to the pixel electrode 554, and a third interlayer insulating film 555 is formed. It is possible to easily form a tapered sidewall by using the wet etching method when the opening is formed. If the sidewall of the opening does not have a sufficiently gentle slope, deterioration of the EL layer caused by level differences will lead to an important problem.

Thereafter, an EL layer 556 and a cathode (MgAg electrode) 557 are continuously formed by the vacuum deposition method without air exposure. Preferably, the film thickness of the EL layer 556 is 800–200 nm (100–120 nm typically), and the thickness of the cathode 557 is 180–300 nm (200–250 nm typically).

In this process, an EL layer and a cathode are sequentially formed for a pixel corresponding to red, a pixel corresponding to green, and a pixel corresponding to blue. However, since the EL layer is poor in tolerance to solutions, they must be independently formed for each color without using the photolithography technique. Thus, it is preferable to conceal pixels except a desired one by the use of the metal mask, and selectively form an EL layer and a cathode for the desired pixel.

In detail, a mask is first set for concealing all pixels except a pixel corresponding to red, and an EL layer and a cathode of red luminescence are selectively formed by using the mask. Thereafter, a mask is set for concealing all pixels except a pixel corresponding to green, and an EL layer and a cathode of green luminescence are selectively formed by the mask. Thereafter, as above, a mask is set for concealing all pixels except a pixel corresponding to blue, and an EL layer and a cathode of blue luminescence are selectively formed by the mask. In this case, the different masks are used for the respective colors. Instead, the same mask may be used for them. Preferably, processing is performed without breaking the vacuum until the EL layer and the cathode are formed for all the pixels.

A known material can be used for the EL layer 556. Preferably, as a known materials, that is an organic material in consideration of driving voltage. For example, the EL layer can be formed with a four-layer structure consisting of a hole injecting layer, a positive hole transporting layer, a light emitting layer, and an electronic injection layer. Further, as a cathode of an EL element, MgAg electrode is used. Other known material such as Yb can be used.

Further, as a protecting electrode 558, a conductive film comprising aluminum as a main component may be used. The protecting electrode 558 may be formed by using a mask which is different from one used at the time of forming an EL layer and a cathode, by vapor deposition method. Further, it is preferable that the protecting electrode is continuously formed after forming an EL layer and a cathode without air exposure.

Lastly, the second passivation film 559 made of silicon nitride film is formed at a thickness of 300 nm. In practice, the protecting electrode 558 functions to protect an EL layer from moisture or the like. In addition, the second passivation film 559 is formed, thereby improving the reliability of an EL element.

Figure 20C:
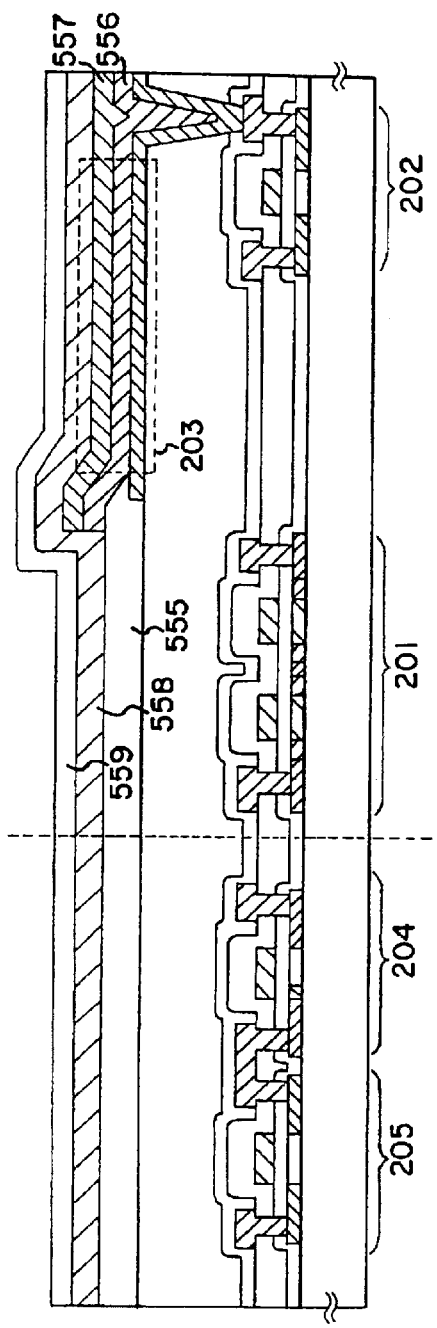

In this way, an active matrix type EL display device constructed as shown in FIG. 20(C) is completed. In practice, preferably, the device is packaged (sealed) by a highly airtight protective film (laminate film, ultraviolet cured resin film, etc.) or a housing material such as a ceramic sealing can, in order not to be exposed to the air when completed as shown in FIG. 20(C). In that situation, the reliability (life) of the EL layer is improved by making the inside of the housing material an inert atmosphere or by placing a hygroscopic material (for example, barium oxide) therein.

After airtightness is improved by packaging or the like, a connector (flexible print circuit: FPC) for connecting a terminal drawn from the element or circuit formed on the substrate to an external signal terminal is attached, and a product is completed. In this specification, the EL display device, thus wholly prepared for market, is called as an EL module.

Figure 21:
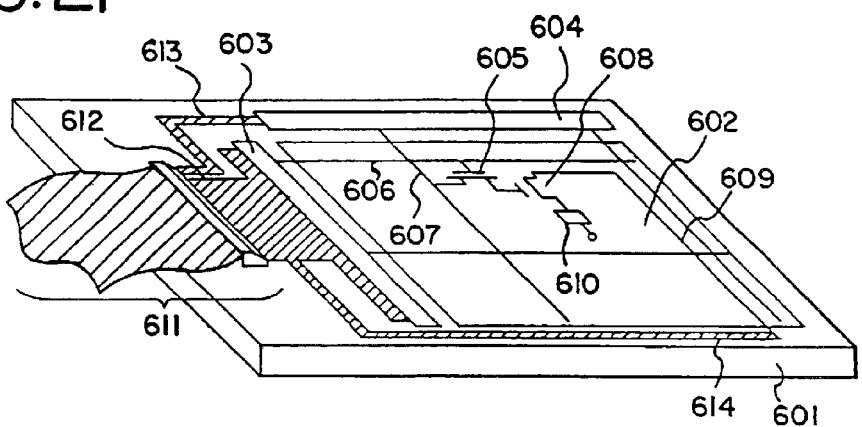
FIG. 21 is a diagram showing an external view of an EL module.

The constitution of the active matrix type EL display device of the present embodiment is explained here using the perspective view of FIG. 21. The active matrix type EL display device of the embodiment is formed on a glass substrate 601, and is composed of a pixel portion 602, a gate side driving circuit 603, and a source side driving circuit 604. A switching TFT 605 of the pixel portion is an n-channel TFT, and is placed at the intersection of a gate wiring 606 connected to the gate side driving circuit 603, and a source wiring 607 connected to the source side driving circuit 604. Furthermore, the drain of the switching TFT 605 is electrically connected to the gate of a current control TFT 608.

In addition, the source side of the current control TFT 608 is connected to a current supply line 609. According to the structure of the present embodiment, the current control TFT 609 is provided with an earth potential. Further, an EL element 610 is connected to the drain of the current control TFT 608 and, a predetermined voltage (10 to 12V in the present embodiment) is applied to a cathode of the EL element 610.

Then, an input and output wirings (connection wiring) 612 and 613, and an input and output wiring 614 connected to the current supply line 609, are then formed in FPC 611 which becomes an external input and output terminal in order to transfer signals to the driver circuit.

Figure 22A:
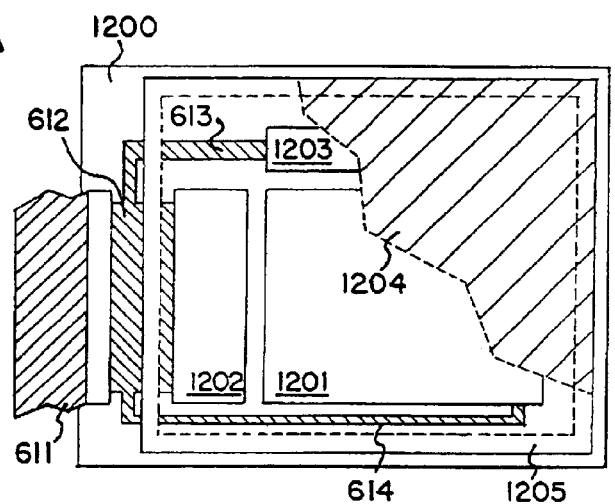
FIGS. 22A and 22B are diagrams showing an external view of an EL module.
Figure 22B:
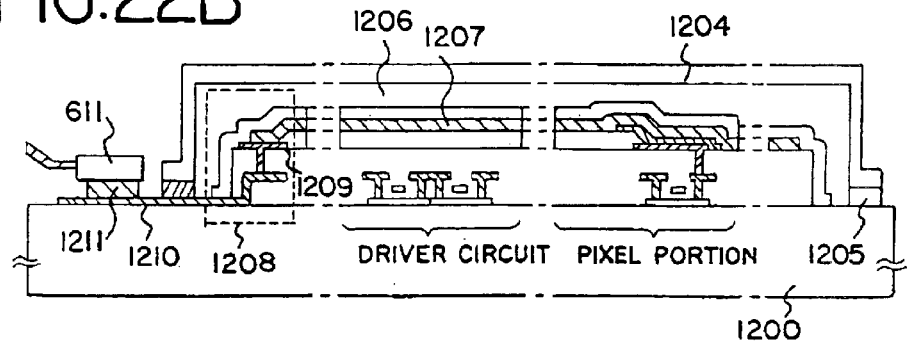

An explanation of the EL module of the present embodiment, containing the housing material, is made using FIGS. 22(A) and 22(B). Note that, when necessary, the marks used in FIG. 21 are cited.

A pixel portion 1201, a source driving circuit 1202, and a gate driving circuit 1203 are formed on a substrate 1200. Various wirings from the respective driver circuits are connected to external equipment, via the FPC 611, through the input and output wirings 612 to 614.

A housing material 1204 is formed at this point enclosing at least the pixel portion, and preferably the driving circuits and the pixel portion. Note that the housing material 1204 is of an irregular shape in which the internal size is larger than the external size of the EL element, or has a sheet shape, and is fixed to the substrate 1200 by an adhesive 1205 so as to form an airtight space jointly with the substrate 1200. At this point, the EL element is in a state of being completely sealed in the above airtight space, and is completely cutoff from the external atmosphere. Note that a multiple number of housing materials 1204 may be formed.

It is preferable to use an insulating substance such as a glass or a polymer as the housing material 1204. The following can be given as examples: amorphous glass (such as borosilicate glass or quartz); crystallized glass; ceramic glass; organic resins (such as acrylic resins, styrene resins, polycarbonate resins, and epoxy resins); and silicone resins. In addition, ceramics may also be used. Furthermore, provided that the adhesive 1705 is an insulating material, it is also possible to use a metallic material such as a stainless alloy.

It is possible to use an adhesive such as an epoxy resin or an acrylate resin as the material of the adhesive 1205. In addition, a thermally hardened resin or a light hardened resin can also be used as the adhesive. Note that it is necessary to use a material through which, as much as is possible, oxygen or moisture is not transmitted.

In addition, it is preferable to fill an opening 1206 between the housing material and the substrate 1200 with an inert gas (such as argon, helium, or nitrogen). There are no limitations on a gas, and it is also possible to use an inert liquid (such as a liquid fluorinated carbon, typically perfluoroalkane). The materials such as those used by Japanese Patent Application Laid-open No. Hei 8-78519 may be referred to regarding inert liquids.

It is effective to form drying agent in the opening 1206. Materials such as those recorded in Japanese Patent Application Laid-open No. Hei 9-148066 can be used as the drying agent. Typically, barium oxide may be used.

A plurality of pixels having isolated EL elements are formed in the pixel portion, as shown in FIG. 22(B), and all of the pixels have a protecting electrode 1207 as a common electrode. In the embodiment, it is preferable to form the EL layer, the cathode (MgAg electrode), and the protecting electrode in succession, without exposure to the atmosphere. The EL layer and the cathode are formed using the same mask material, and provided that only the protecting electrode is formed by a separate mask material, then the structure of FIG. 22(B) can be realized.

The EL layer and the cathode may be formed only in the pixel portion at this point, and it is not necessary to form them on the driving circuits. There is no problem, of course, with forming them on the driving circuits, but considering the fact that alkaline metals are contained in the EL layer, it is preferable to not form it over the driving circuits.

Note that the protecting electrode 1207 is connected to an input and output wiring 1210 through a connection wiring 1209 made of the same material as the pixel electrode in a region shown by reference numeral 1208. The input and output wiring 1210 is a wiring for providing a predetermined voltage (earth potential in the present embodiment, specifically 0V) to the protecting electrode 1207, and is connected to the FPC 611 through a conducting paste material 1211.

Figure 23A:
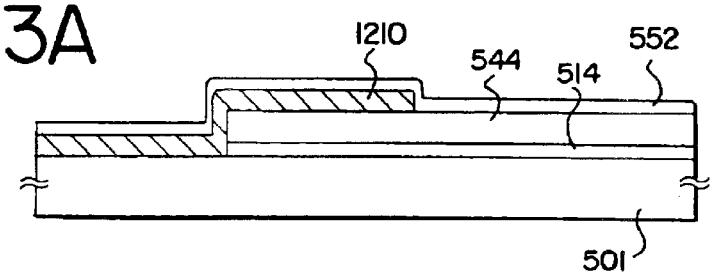
FIGS. 23A to 23C are diagrams showing a process of manufacturing a contact structure.
Figure 23B:
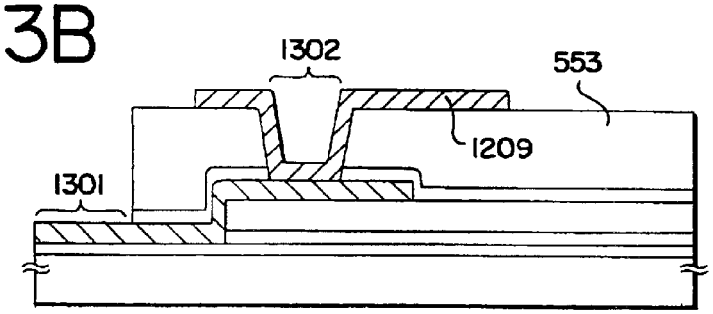

A manufacturing process for realizing a contact structure in the region 1208 is explained here using FIG. 23.

First, the state of FIG. 20(A) is obtained in accordance with the processes of the embodiment. At this point, the first interlayer insulating film 544 and the gate insulating film 514 are removed from the edges of the substrate (in the region shown by reference numeral 1208 in FIG. 22(B)), and the input and output wiring 1210 is formed on that region. The source wirings and the drain wirings of FIG. 20(A) are of course formed at the same time. (See FIG. 23(A))

Next, in FIG. 20(B), when the second interlayer insulating film 553 and the first passivation film 552 are etched, a region shown by reference numeral 1301 is removed, and an opening portion 1302 is formed. Then, a connection wiring 1209 is formed to cover the opening portion 1302. Of course, the connection wiring 1209 and a pixel electrode 554 are formed at the same time in FIG. 20(B). (See FIG. 23(B))

Figure 23C:
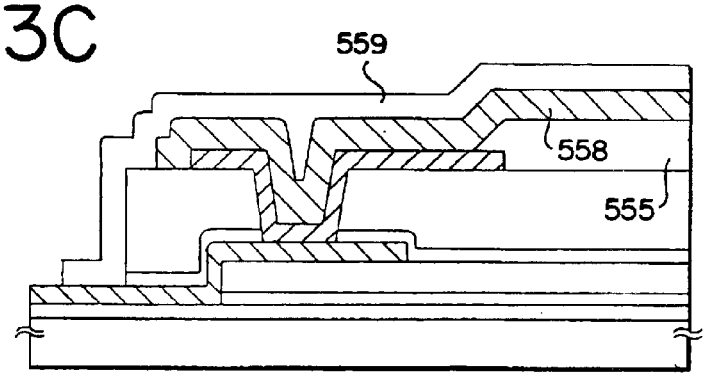

The processes of forming the EL element (the third interlayer insulating film, EL layer, and cathode formation processes) in the pixel portion are performed in this state. At this time, a mask or the like is used in the region shown in FIG. 13 so that the third interlayer insulating film and the EL element are not formed in this region. After forming the cathode 557, the protecting electrode 558 is formed using a separate mask material. The protecting electrode 558 and the input and output wiring 1210 are thus electrically connected through the connection wiring 1209. Further, a second passivation film 559 is formed, and the state of FIG. 23(C) is obtained.

The contact structure of the region shown by reference numeral 1208 in FIG. 22(B) is thus realized by the above steps. The input and output wiring 1210 is then connected to the FPC 611 through the opening between the housing material 1204 and the substrate 1200 (note that this is filled by the adhesive 1205; in other words, it is necessary for the thickness of the adhesive 1205 to be such that it can sufficiently level the step of the input and output wiring). Note that an explanation of the input and output wiring 1210 is made here, but the other output wirings 612 to 614 are also similarly connected to the FPC 611 by passing under the housing material 1204.

Embodiment 4

Figure 24A:
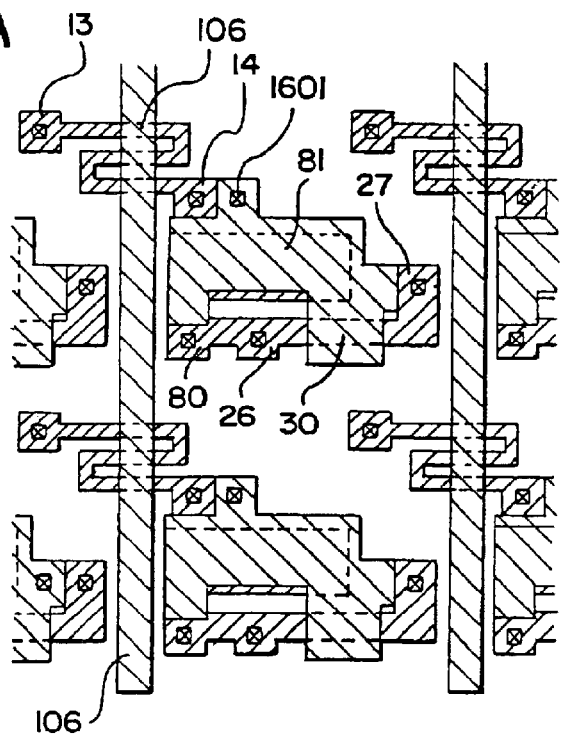
FIGS. 24A and 24B are diagrams showing a top structure of a pixel portion of an EL display device.
Figure 24B:
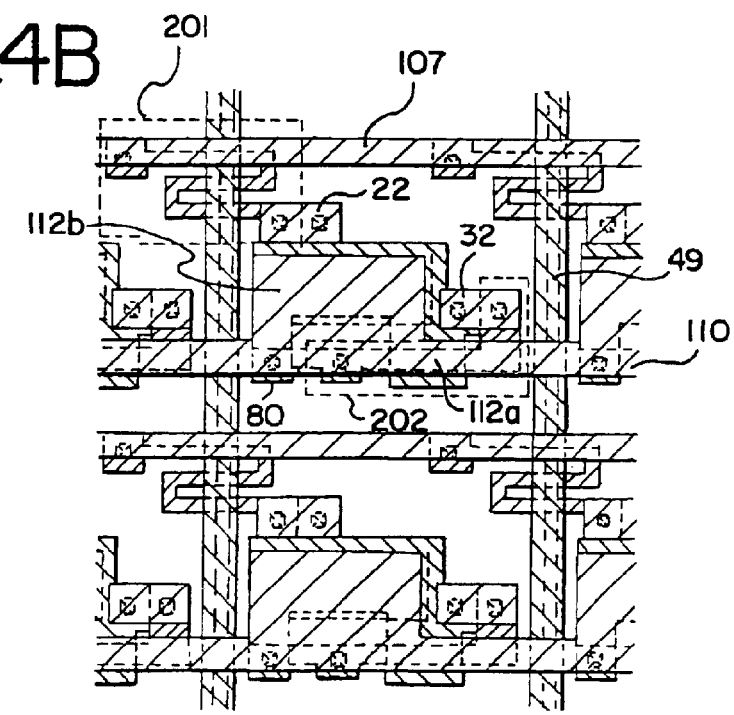

An example of a pixel structure of an active matrix type EL display device manufactured in accordance with embodiment 3 is explained in embodiment 4. FIGS. 24A and 24B are used in the explanation. Note that, for convenience, portions in FIGS. 24A and 24B corresponding to FIGS. 1A and 1B, and to FIG. 2, are denoted by the symbols used in FIGS. 1A, 1B, and 2.

Further, FIG. 24A shows a pixel structure before depositing a second wiring (a source line and an electric current supply line), while FIG. 24B shows the structure before formation of an EL layer.

In FIG. 24, reference numeral 201 denotes the switching TFT, containing the source region 13, the drain region 14, and the gate electrode 106. Further, reference numeral 202 denotes the electric current control TFT, containing the source region 26, the drain region 27, and the gate electrode 30. In addition, the electric current control TFT 202 and the pixel electrode 49 are electrically connected through the drain line 32.

The drain wiring 22 of the switching TF 1201 is electrically connected to the gate electrode 30 of the electric current control TFT 202 at this point by a contact portion 1601. Furthermore, the gate electrode 30 forms a storage capacitor (A) 112a in a portion overlapping the electric current supply line 110. By aligning the electric current supply line 110 in a shape so as to overlap the gate electrode 30 at this point, the capacitance of the storage capacitor (A) 112a can be increased without reducing the aperture ratio of the pixel.

Further, a semiconductor film 81 electrically connected to the electric current supply line 110 by a contact portion 80 overlaps the gate electrode 30 and forms a storage capacitor (B) 112b. The dielectric at this time is an insulating film of the same layer as a gate insulating film.

The storage capacitor (A) 112a and the storage capacitor (B) 112b are connected in parallel in the pixel structure of FIGS. 24A and 24B, functioning as the storage capacitor 112.

Note that the source region 26 of the electric current control TFT 202 and the semiconductor film 81 are electrically connected to the electric current supply line 110 by separate contact portions. This shall next be explained. Phosphorous is doped into the semiconductor film 81, which becomes a bottom side electrode of the storage capacitor (B) 112b, and boron is doped into an active layer of the electric current control TFT 202 because it is a p-channel TFT. In other words, a semiconductor region into which phosphorous is doped and a semiconductor region into which boron is doped are adjacent, and it is thought that a rectification action develops because a p-n junction is formed. Considering this, the source region 26 of the electric current control TFT 202 and the semiconductor film 81 are each electrically connected to the electric current supply line 110 separately.

Note that the pixel structure shown in FIGS. 24A and 24B in embodiment 4 does not place any limitations on the present invention, and is only a preferable example. The operator may suitably design so that the switching TFT, the electric current control TFT, and the storage capacitor are formed in any location. It is possible to implement the constitution of embodiment 4 by freely combining with the constitution of any of embodiments 1 to 3.

The structure of embodiment 4 is particularly effective for cases in which the surface area of an image display region becomes large. The reason for this is explained below.

The EL display device of the present invention divides one frame into a plurality of fields and then performs driving, and therefore load applied to the driver circuit for driving the pixel portion is large. It is preferable to reduce the load of the pixel portion (such as wiring resistance, parasitic capacitance, or TFT write-in capacitance) as much as is possible in order to reduce this burden.

The parasitic capacitance added to data wirings and gate wirings in the TFT write-in is largely formed between the cathodes (or the protecting electrodes) of the EL elements formed on the wirings. This point can be nearly ignored because an organic resin film having a low dielectric constant is formed with a thickness of 1.5 to 2.5 μm as the second interlayer insulating film.

Thus the largest hindrance in implementing the present invention in an EL display device having a large surface area in the pixel portion is the wiring resistance of the data wirings and the gate wirings. It is of course possible to divide the source driver circuits into a plurality of circuits and perform parallel processing, form the source driver circuits and the gate driver circuits sandwiching the pixel portion and send signals from both directions, and effectively reduce the operating frequency of the driver circuits. However, in that case separate problems, such as the exclusive surface area of the driver circuits increasing, develop.

Therefore, reducing the wiring resistance of the gate wirings as much as possible in accordance with a structure such as that of embodiment 4 is extremely effective in implementing the present invention. Note that the pixel structure shown in FIGS. 24A and 24B in embodiment 4 does not place any limitations upon the present invention, and is only one preferable example. Further, it is possible to implement embodiment 4 in free combination with the constitution of any of embodiments 1 to 3.

Embodiment 5

Figure 25:
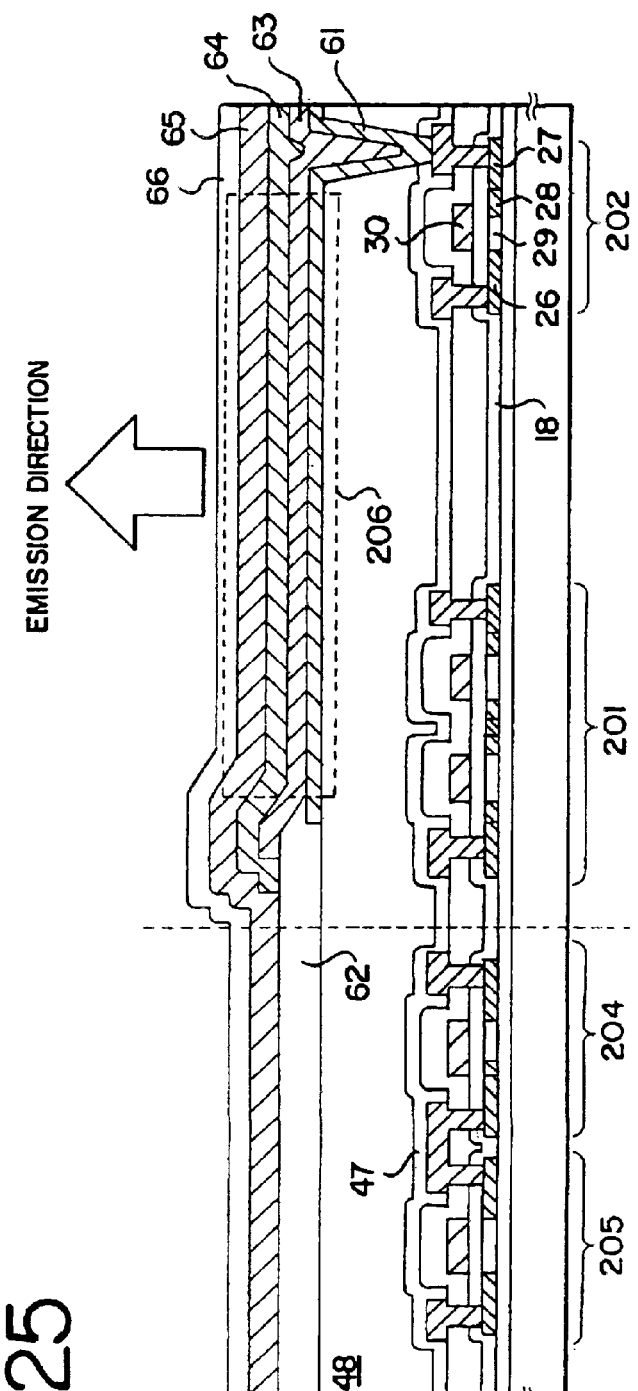
FIG. 25 is a diagram showing a cross sectional structure of an EL display device.

A case of forming a pixel portion having a structure which differs from that of FIG. 2 is explained in embodiment 5 using FIG. 25. Note that an electric current control TFT 206 covered by the second interlayer insulating film 48 shown in FIG. 25 has a structure which differs from that of FIG. 2.

Furthermore, an EL display device shown in FIG. 25 is structured having the LDD region 28 formed between the drain region 27 and the channel forming region 29, and having a region in which the LDD region 28 sandwiches the gate insulating film 18 and overlaps the gate electrode 30, and a region in which there is no overlap.

Note that a switching TFT may be formed by a p-channel TFT or by an n-channel TFT in embodiment 5, but it is preferable to form the electric current control TFT by an n-channel TFT.

A relatively large amount of electric current flows in the electric current control TFT 206 in order to make the EL element 203 emit light, and therefore it is preferable to take steps against deterioration due to hot carrier injection. Furthermore, when displaying the color black the electric current control TFT 206 is placed in the off state, but if the off current is large at that time then a clean black color cannot be displayed and this invites a reduction in the contrast and the like. It is therefore necessary to suppress also the off current.

Regarding degradation due to hot carrier injection, it is known that a structure in which the LDD region overlaps with respect to the gate electrode is extremely effective. However, if the entire LDD region overlaps, then the off current increases, and therefore the applicant of the present invention solves the hot carrier injection problem and the off current problem at the same time by a novel structure in which an LDD region that does not overlap the gate electrode is formed in series in addition to the above structure.

The length of the LDD region overlapping the gate electrode at this point may be from 0.1 to 3 μm (preferably between 0.3 and 1.5 μm). Further, the length of the LDD region not overlapping the gate electrode may be from 1.0 to 3.5 μm (preferably between 1.5 and 2.0 μm). If too long, then a sufficient amount of current will not flow, and if too short, then the off current reduction effect is weakened. Note that it is possible to omit the LDD region which does not overlap the gate electrode, and only form the LDD region overlapping the gate electrode.

Further, a parasitic capacitance is formed by the region in which the gate electrode and the LDD region overlap in the above structure, and therefore it is preferable not to form this between the source region 26 and the channel forming region 29. The carrier (electrons here) flow direction is always the same for the electric current control TFT, and therefore it is sufficient to only form the LDD region on the drain region side.

On the other hand, the parasitic capacitance formed by the region in which the LDD region and the gate electrode formed in the drain side overlap is specifically utilized, and it can be given the same function as the storage capacitor 112 of FIGS. 1A and 1B. In this case it is possible to use jointly with the storage capacitor 112, and it is also possible to use as a substitute for the storage capacitor 112, and the storage capacitor 112 can be omitted. The aperture ratio can be greatly increased provided that the storage capacitor 112 can be omitted.

After forming contact holes in the second interlayer insulating film 48 and in the first passivation film 47 in the case of the embodiment 5, a pixel electrode 61 which becomes a cathode is formed. A 200 nm thick aluminum alloy film (an aluminum film containing 1 wt % titanium) is formed as the pixel electrode 61 in embodiment 5. Note that any material may be used as the pixel electrode material, provided that it is a metallic material, and a material having a high reflectivity is preferable.

A third interlayer insulating film 62 is then formed on the pixel electrode 61 from a silicon oxide film having a thickness of 300 nm, and next an EL layer 63 is formed, composed from the bottom of a 20 nm electron transporting layer, a 40 nm light emitting layer, and a 30 nm pole transporting layer. Note that it is necessary to form the EL layer 63 so that it has a slightly larger pattern than that of the pixel electrode 61. Sort between the pixel electrode 61 and an anode 65 formed later can be prevented by doing so.

Note that a material such as BCP or $Alq_3$ can be used in the electron transporting layer as the EL material forming the EL layer used here.

Further, CBP and $Ir(ppy)_3$, aluminum quinolinolate complex ($Alq_3$), and benzo-quinolinolate beryllium (BeBq) can be used in the light emitting layer. In addition, a material such as aluminum quinolinolate complex ($Alq_3$) into which coumarin 6 or quinacridon is doped can be used as the light emitting material.

In addition, materials such as an aluminum quinolinolate complex ($Alq_3$) doped with DCM-1 can also be used as the light emitting material, in addition to Eu complexes (Eu $(DCM)_3$(Phen)). In addition to DPVBi, a distal dielectric, a zinc compound possessing an azomethine in its ligands, or DPVBi doped with perillin can also be used as the light emitting layer.

Next, the aromatic amine MTDATA, referred to as starburst amine, á-NPD, compounds such as TPAC, PDA, and TPD, polymer compounds in which polyvinyl carbazole (PVK) or TPD combined in principal or side chains can be used as the pole transporting layer.

Note that the pixel electrode 61 and the EL layer 63 are formed in succession without exposure to the atmosphere by using a multi-chamber method (also referred to as cluster tool) vacuum evaporation apparatus. The process of forming the third interlayer insulating film 62 is entered in embodiment 5, and preferably, after forming the pixel electrode 61 and the third interlayer insulating film 62 by patterning, an oxide film on the pixel electrode 61 is sufficiently removed and then an EL layer which emits red color light is formed using a metal mask. Then while precisely controlling the metal mask it is shifted over and a green light emitting EL layer and a blue light emitting EL layer are formed in order.

Note that a second mask may simply be shifted in the above method in which the pixels corresponding to RGB are lined up in a striped pattern. However, in order to realize a pixel structure having a delta arrangement, a metal mask for forming the green color light emitting EL layer and a metal mask for forming the blue color light emitting EL layer may be used separately.

After thus forming through the EL layer 63, an anode 65 made from a transparent conducting film (a thin film containing 10 wt % zinc oxide in an ITO film in embodiment 5) is formed on the EL layer 63 with a thickness of 110 nm. The EL element 206 is thus formed, and provided that a second passivation film 66 is formed from a silicon nitride film, a pixel having a structure like that shown in FIG. 25 is completed.

Note that the cathode and the anode have positions opposite those of FIG. 2 in this case.

The opposite side of the substrate (namely, the top surface side when seen by a cross sectional diagram) on which the TFTs are formed is irradiated by red color, blue color, and green color light formed by pixels when using the structure of embodiment 5. Therefore nearly the entire region within the pixel, namely the region in which the TFTs are formed, can be used as an effective light emitting region. As a result, the effective light emitting surface area of the pixels is greatly increased, and the image brightness and the contrast ratio are increased.

Note that it is possible to freely combine the constitution of embodiment 5 with the constitution of any of embodiments 1 to 4.

Embodiment 6

It is effective to use a material possessing high heat radiation effect as the base film 12 formed between the active layer and the substrate 11 in the structures of FIG. 2 of embodiment 1. In particular, since a large amount of current flows in the current control TFT, heat is easily generated, and deterioration due to self generation of heat becomes a problem. Thermal deterioration of the TFT can be prevented by using the base film of embodiment 6, which possesses heat radiation effect, for this type of case.

As a light transparent material possessing heat radiation effect, an insulating film containing at least one element selected from the group consisting of B (boron), C (carbon), and N (nitrogen), and at least one element selected from the group consisting of Al (aluminum), Si (silicon), and P (phosphorous) can be given.

For example, it is possible to use: an aluminum nitride compound, typically aluminum nitride ($Al_xN_y$); a silicon carbide compound, typically silicon carbide ($Si_xC_y$); a silicon nitride compound, typically silicon nitride ($Si_xN_y$); a boron nitride compound, typically boron nitride ($B_xN_y$); or a boron phosphate compound, typically boron phosphate ($B_xP_y$). Further, an aluminum oxide compound, typically aluminum oxide ($Al_xO_y$), has superior light transparency characteristics, and has a thermal conductivity of 20 $Wm^{-1}K^{-1}$, and can be said to be a preferable material. Note that x and y are arbitrary integers for the above transparent materials.

The above chemical compounds can also be combined with another element. For example, it is possible to use nitrated aluminum oxide, denoted by $AlN_xO_y$, in which nitrogen is added to aluminum oxide. This material also not only possesses heat radiation effect, but also is effective in preventing the penetration of substances such as moisture and alkaline metals. Note that x and y are arbitrary integers for the above nitrated aluminum oxide.

Furthermore, the materials recorded in Japanese Patent Application Laid-open No. Sho 62-90260 can also be used. Namely, an insulating film containing Si, Al, N, O, and M can also be used (note that M is a rare-earth element, preferably an element selected from the group consisting of Ce (cerium), Yb (ytterbium), Sm (samarium), Er (erbium), Y (yttrium), La (lanthanum), Gd (gadolinium), Dy (dysprosium), and Nd (neodymium)). These materials not only possess heat radiation effects, but also are effective in preventing the penetration of substances such as moisture and alkaline metals.

Furthermore, carbon films such as a diamond thin film or amorphous carbons film (especially those which have characteristics close to those of diamond; referred to as diamond-like carbon) can also be used. These have very high thermal conductivities, and are extremely effective as radiation layers. Note that if the film thickness becomes larger, there is brown banding and the transmissivity is reduced, and therefore it is preferable to use as thin a film thickness (preferably between 5 and 100 nm) as possible.

Further, a thin film made from a material possessing the above heat radiation effect can be used by itself, but it is effective to laminate this thin film and an insulating film having silicon.

Note that it is possible to freely combine the constitution of the embodiment 6 with constitutions of any of the embodiments 1 to 5.

Embodiment 7

In the Embodiment 3, it is preferable to use an organic EL material as an EL layer, but the present invention can also be implemented by using an inorganic EL material. However, since current inorganic EL materials have an extremely high driving voltage, a TFT which has voltage resistance characteristics that can withstand the driving voltage must be used.

Alternatively, if inorganic EL materials having lower driving voltages are developed in future, it is possible to apply them to the present invention.

Note that it is possible to freely combine the constitution of embodiment 7 with constitutions of any of the embodiments 1 to 6.

Embodiment 8

Figure 28A:
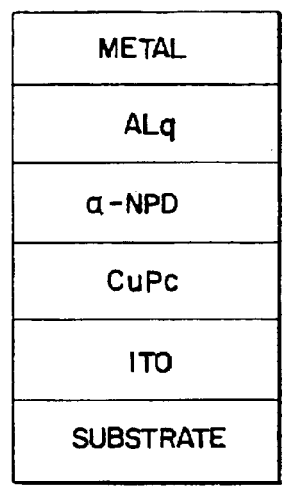
FIGS. 28A and 28B are diagrams showing an element structure of an EL element.
Figure 28B:
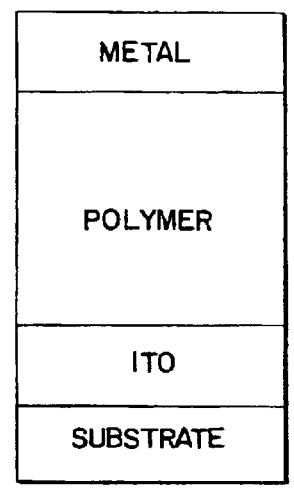

An example of an element structure of an EL element used in implementing the present invention is shown in FIGS. 28A and 28B. FIG. 28A is a case of using a low molecular weight EL material, and after forming an ITO electrode (shown by ITO in FIG. 28A) on a substrate, copper phthalocyanine (CuPc) is used in a buffer layer of an anode, a-NPD is used in a pole transporting layer, and Alq is used in a light emitting layer. The film deposition method is evaporation, and the films are laminated in order on the ITO electrode on the substrate. Note that the pressure during evaporation is equal to or less than $2\times10^{-6}$ Torr.

An element structure for a case of using a high molecular weight (polymer) EL material is shown in FIG. 28B. An ITO electrode is formed on a substrate, a polymer layer is spin coated, and in addition a cathode (metallic) is formed by evaporation. The pressure during evaporation is equal to or less than $4\times10^{-6}$ Torr. The light emitting layer is shared among all pixels in embodiment 8, and a mono-color panel is manufactured. In addition, a metal mask is used when forming the cathode by evaporation, and the metal is deposited only in required portions. Further, the manufactured element is later sealed using a resin.

Furthermore, it is possible to freely combine the constitution of embodiment 8 with the constitution of any of embodiments 1 to 7.

Embodiment 9

Figure 29:
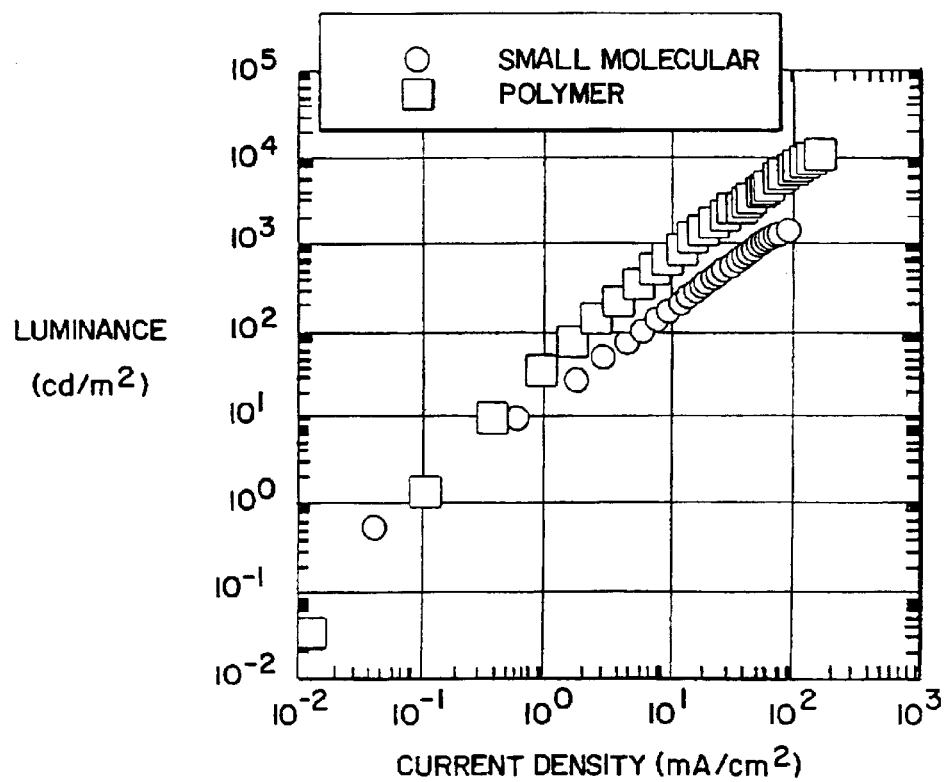
FIG. 29 is a diagram showing the characteristics of an EL element.

The characteristics of the EL element explained in embodiment 8 are shown in FIG. 29. This is a measurement of electric current density and brightness when a fixed voltage is applied to the EL element. The results show that both a low molecular weight EL element and a high molecular weight EL element have several hundred candela at 10 $mA/cm^2$, and that they are sufficiently efficient to be used as an EL display.

Embodiment 10

An EL display which applies a self luminescing device, and its driving method, of the present invention has superior visibility in a bright location in comparison with a liquid crystal display because it is self luminescing, and also has a wide angle of view. Therefore it can be used as a display portion of various electronic devices. For example, the self luminescing device of the present invention and its driving method may be used in the display portion of a 30 inch or larger (typically 40 inch or larger) diagonal EL display for appreciation of a TV broadcast or the like by a large screen.

Note that all display devices for displaying information, such as a personal computer display device, a display device for receiving TV broadcasts, and a display device for displaying advertisements, are included in EL displays. Further, the self luminescing device of the present invention, and its driving method, can also be used in the display portion of various other electronic devices.

The following can be given as this type of electronic equipment of the present invention: a video camera; a digital camera; a goggle type display device (head mounted display); a navigation system; an audio playback device (such as a car audio system or an audio combo system); a notebook type personal computer; a game apparatus; a portable information terminal (such as a mobile computer, a portable telephone, a portable game machine, or an electronic book); and an image playback device equipped with a recording medium (specifically, device prepared with a display which plays back a recording medium such as a digital video disk (DVD) and displays that image). In particular, a wide angle of view is important for a portable information terminal often seen from an oblique angle, and therefore it is preferable to use an EL display. Specific examples of these electronic devices are shown in FIGS. 30A to 30F and FIGS. 31A to 31C.

Figure 30A:
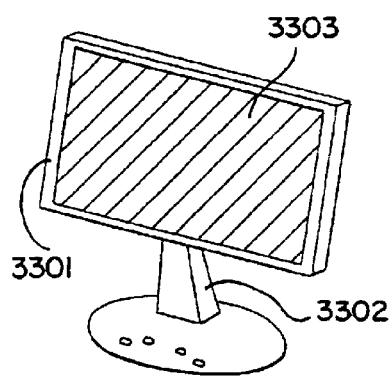
FIGS. 30A to 30F are diagrams showing specific examples of electronic devices.

FIG. 30A is an EL display, and contains a frame 3301, a support stand 3302, and a display portion 3303, etc. The self luminescing device of the present invention and its driving method can be used in the display portion 3303. The EL display is a self luminescing type, and therefore a back light is not necessary, and the display portion can be made thinner than that of a liquid crystal display device.

Figure 30B:
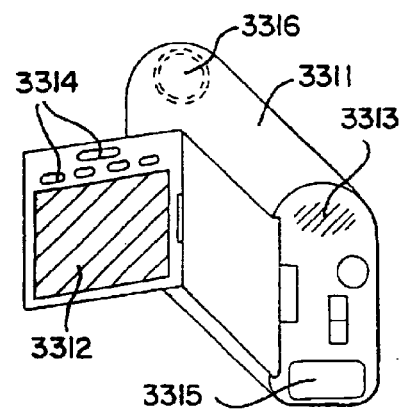

FIG. 30B is a video camera, and contains a main body 3311, a display portion 3312, a sound input portion 3313, operation switches 3314, a battery 3315, and a receiving portion 3316. The self luminescing device of the present invention and its driving method can be used in the display portion 3312.

Figure 30C:
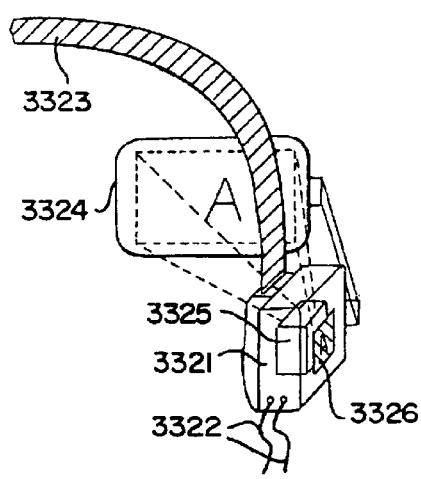

FIG. 30C is a portion (right side) of a head mounted EL display, and contains a main body 3321, a signal cable 3322, a head fixing and 3323, a projecting portion 3324, an optical system 3325, and a display portion 3326, etc. The self luminescing device of the present invention and its driving method can be used by the display portion 3326.

Figure 30D:
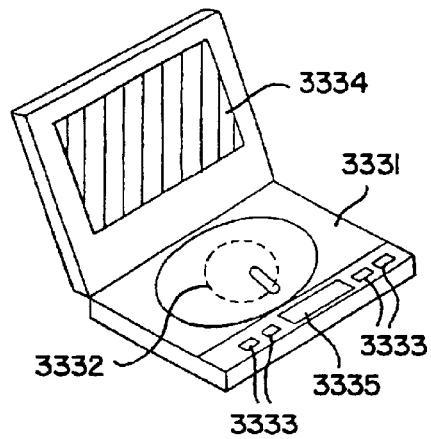

FIG. 30D is an image playback device equipped with a recording medium (specifically, a DVD playback device), and contains a main body 3331, a recording medium (such as a DVD) 3332, operation switches 3333, a display portion (a) 3334, and a display portion (b) 3335, etc. The display portion (a) 3334 is mainly used for displaying image information, and the display portion (b) is mainly used for displaying character information, and the self luminescing device of the present invention and its driving method can be used by the display portion (a) 3334 and by the display portion (b) 3335. Note that the image playback device equipped with the recording medium includes devices such as household game machines.

Figure 30E:
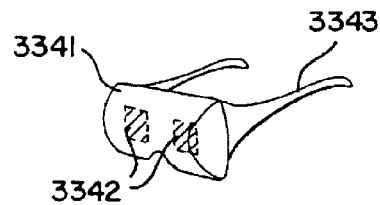

FIG. 30E is a goggle type display device (head mounted display), and contains a main body 3341, a display portion 3342, and an arm portion 3343. The self luminescing device of the present invention and its driving method can be used in the display portion 3342.

Figure 30F:
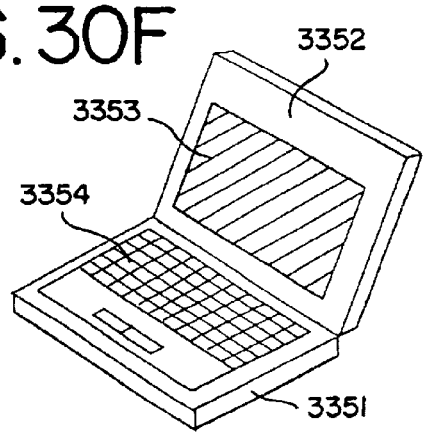

FIG. 30F is a personal computer, and contains a main body 3351, a frame 3352, a display portion 3353, and a keyboard 3354. The self luminescing device of the present invention and its driving method can be used in the display portion 3353.

Note that if the brightness of light emitted by EL materials increases in the future, then it will become possible to use in a front type or a rear type projector to expand and project light containing output image information with a lens or the like.

Further, the above electronic devices are more and more often displaying information delivered via an electronic communication line, such as the Internet or CATV (cable television), and opportunities to display moving information in particular are increasing. The response speed of EL materials is extremely high, and therefore it is preferable to use the EL display for motion display.

In addition, since the EL display conserves power in the light emitting portion, in order to make a display device conserve more energy it is therefore preferable to use the EL display for displaying information so as to make the light emitting portions as few as possible. Consequently, when using the EL display in a display portion mainly for character information, such as in a portable information terminal, in particular a portable telephone of an audio playback device, it is preferable to drive so as to form character information by the light emitting portions while non-light emitting portions are set as background.

Figure 31A:
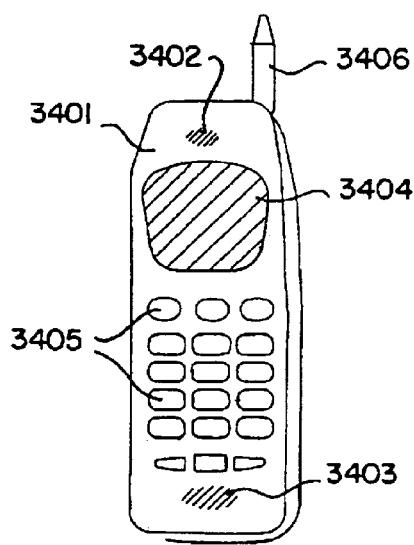
FIGS. 31A to 31C are diagrams showing specific examples of electronic devices.

FIG. 31A is a portable telephone, and contains a main body 3401, a sound output portion 3402, a sound input portion 3403, a display portion 3404, operation switches 3405, and an antenna 3406. The self luminescing device of the present invention and its driving method can be used in the display portion 3404. Note that by displaying white color characters in a black color background, the display portion 3404 can suppress the power consumption of the portable telephone.

Figure 31B:
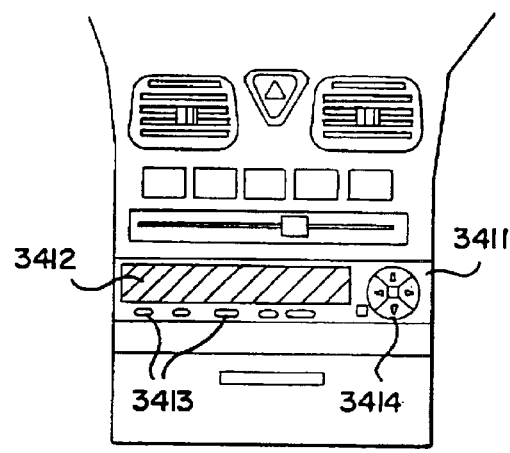

FIG. 31B is an audio playback device, specifically a car audio system, and contains a main body 3411, a display portion 3412, and operation switches 3413 and 3414. The self luminescing device of the present invention, and its driving method, can be used by the display portion 3412. Further, a car audio system is shown in embodiment 10, but a portable type or a household audio playback system may also be used. Note that by displaying white color characters in a black color background, the display portion 3414 can suppress the power consumption. This is especially effective in a portable type audio playback device.

Figure 31C:
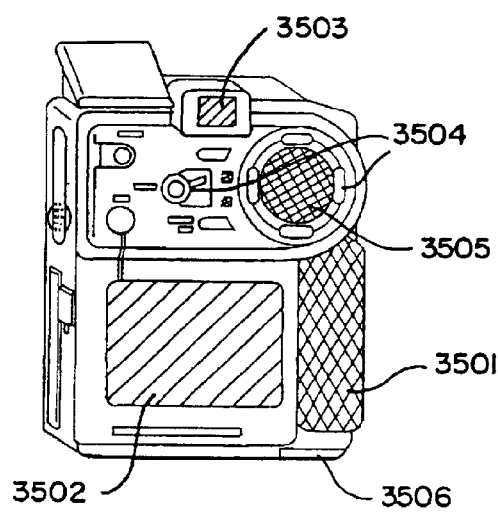

FIG. 31C is a digital camera, and contains a main body 3501, a display portion (A) 3502, an eye piece 3503, operation switches 3504, a display portion (B) 3505, and a battery 3506. The self luminescing device of the present invention can be used by the display portion (A) 3502 and by the display portion (B) 3505. Further, when the display portion (B) 3505 is mainly used as an operation panel, power consumption can be suppressed by displaying white color characters in a black color background.

Furthermore, a method of adding functionality such as forming a sensor portion for sensing the external brightness, and reducing the brightness of the display portion when used in a dark place can be given as a method for reducing the power consumption in the portable type electronic devices shown in embodiment 10.

In addition, if the brightness of light emitted by EL materials increases in the future, then it will become possible to also use them in a front type of a rear type projector.

The applicable range of the present invention is thus extremely wide, and it is possible to apply the present invention to electronic devices in all fields. Furthermore, the electronic equipment of embodiment 10 can also be realized by using any combination of the embodiments 1 to 8.

Embodiment 11

The results of measuring the amount of power consumption when performing panel display in accordance with digital drive time division gradation using a self luminescing device of the present invention is shown in embodiment 11. Note that the display panel used in the measurements here has the same specifications as those shown by Table 4 of embodiment 1, and that the specific time distribution of the write-in periods and the display periods in one frame period are shown in Table 5.

TABLE 5

| Period | Time (ms) |
| --- | --- |
| 1 frame | 16.67 |
| Write-in | 1.04 |
| Display 1 | 5.21 |
| Display 2 | 2.60 |
| Display 3 | 1.30 |
| Display 4 | 0.65 |
| Display 5 | 0.33 |
| Display 6 | 0.16 |

Furthermore, an EL element is formed as the EL element contained in the self luminescing device used in embodiment 11 by laminating 20 nm of CuPc (hole injecting layer), 20 nm of MTDATA (hole transporting layer), 10 nm of a-NPD (hole transporting layer), 50 nm of $Alq_3$ (light emitting layer), and 400 nm of Yb (cathode) on ITO (anode), and by laminating 20 nm of CuPc (hole injecting layer), 40 nm of á-NPD (hole transporting layer), 20 nm of $Ir(ppy)_3$+ CBP (light emitting layer), 10 nm of BCP (electron transporting layer), 40 nm of $Alq_3$ (electron transporting layer), and 400 nm of Yb (cathode) on Ito (anode).

Note that, in an EL (electroluminescence) utilizing excitation energy, developing in accordance with recombination of poles and electrons for emitting light, the light emitting material $Alq_3$ which utilizes singlet excitation energy is referred here to as a singlet compound, and the compound $IR(ppy)_3$ which utilizes triplet excitation energy is referred to as a triplet compound.

The luminescence and the power consumption with respect to the driving voltage of an EL element having singlet compounds and triplet compounds is then shown in Table 6.

TABLE 6

| | Driving Voltage (V) | Luminance (cd/m$^2$) | Power Consumption (mW) |
| --- | --- | --- | --- |
| Singlet Emitter | 6 | 30 | 6 |
| Triplet Emitter | 6 | 117 | 5 |

Note that when comparing at the same luminescence (specifically 60 cd/m$^2$), the triplet compound shows a power consumption equal to or less than half that of the singlet compound.

Next, measurement of the response time with respect to the voltage of the EL elements having the triplet compounds shown by embodiment 11 is performed.

The measurements are performed with a DC (direct current) applied by an arbitrary electric power supply, and switching between ON and OFF is performed using this DC current. Note that ON denotes a selected period, and that it is referred to as a period in which a voltage is applied. Further, OFF denotes a non-selected period in which the voltage is 0 V Further, all of these periods are 250 μs.

Note that, specifically, a photomultiplier is set in a microscope, and that evaluation is performed by values output from the photomultiplier and read by an oscilloscope.

Further, the switch from OFF to ON is defined as start-up, and the switch from ON to OFF is defined as shutdown.

From the instant that the electric power supply voltage switches from OFF to ON, the time required to show the luminescence that has increased to 90% with respect to the tracking optical response of 100% luminescence is the start-up response time. Further, from the instant that the electric power supply voltage switches from ON to OFF, the time required to show the luminescence that has decreased to 10% with respect to 100% luminescence up until then is the shut-down response time.

Figure 32:
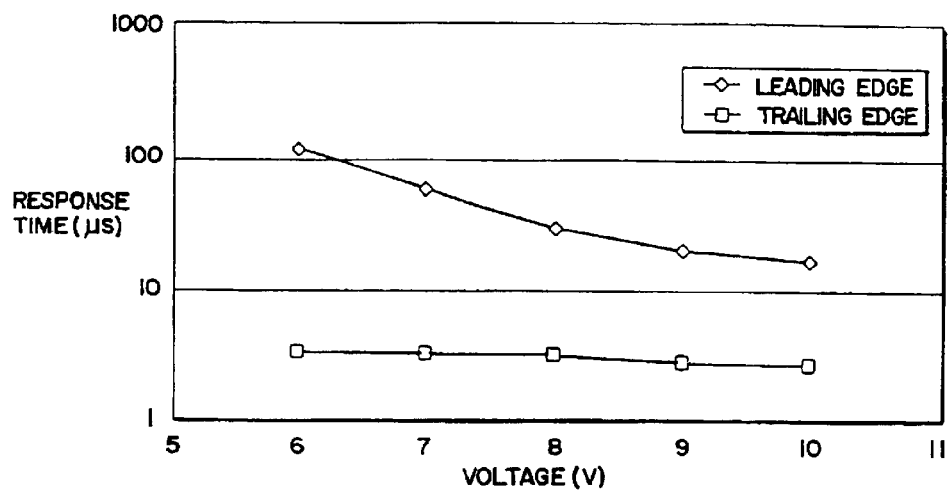
FIG. 32 is a diagram showing the characteristics of an EL element.

Results obtained by these measurements are shown in FIG. 32.

Note that since the response time in the voltage range shown in FIG. 32 is extremely high, the EL element can even be used without problem in a normal digital driver.

Figure 33:
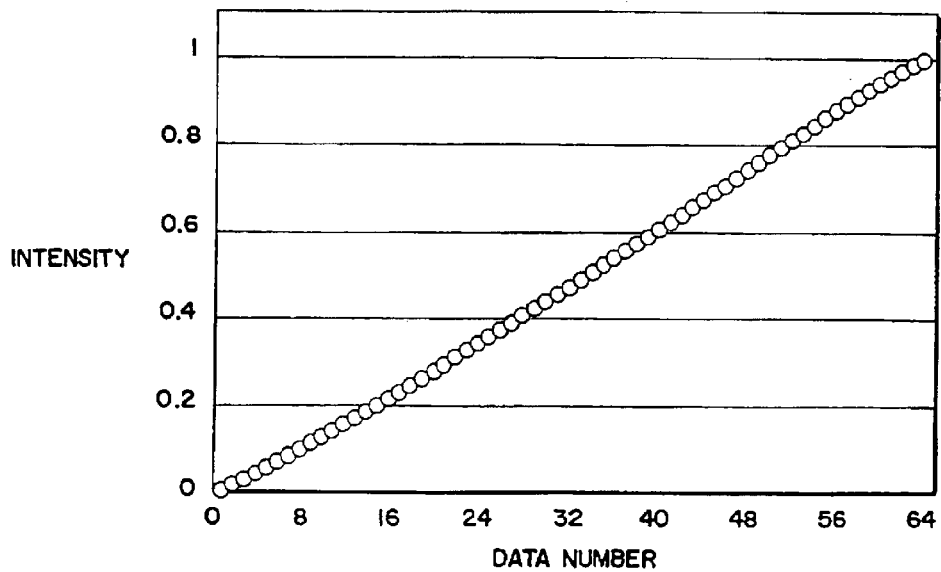
FIG. 33 is a diagram showing the characteristics of an EL element.

In addition, when the luminescence is measured for each gradation when 64 gradation display is performed using this EL element, the results shown in FIG. 33 is obtained. It is understood that sufficient gradation display is performed from the differing light emission strengths obtained.

Embodiment 12

Figure 34:
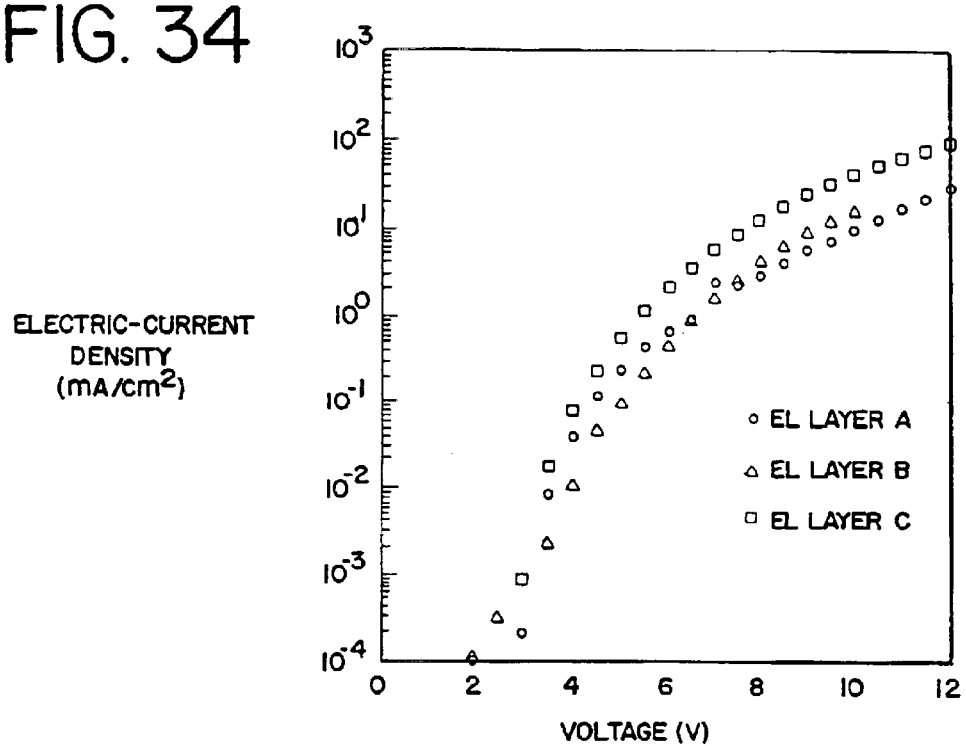
FIG. 34 is a diagram showing the characteristics of an EL element.
Figure 35:
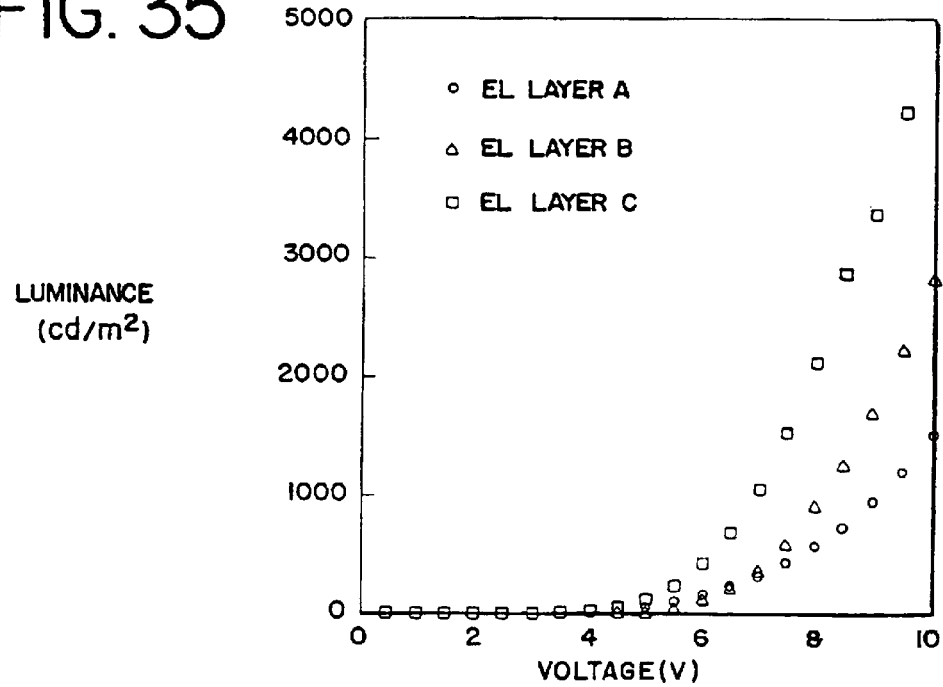
FIG. 35 is a diagram showing the characteristics of an EL element.

Results of measuring the light emitting characteristics for cases of using low molecular weight compounds as a pole injecting layer forming a lamination structure of an EL layer in the EL layer of an EL element, and for cases of using high molecular weight compounds, are shown in FIGS. 34 and 35.

Note that, as the EL layer used here, an EL layer A is formed by laminating 40 nm of α-NPD (pole transporting layer), 20 nm of $Ir(ppy)_3$+CBP (light emitting layer), 10 nm of BCP (electron transporting layer), 40 nm of $Alq_3$ (electron transporting layer), and 400 nm of Yb (cathode) on ITO. Note also that 20 nm of CuPc (hole injecting layer) formed between the ITO of the EL layer A and 40 nm of α-NPD (hole transporting layer) is taken as an EL layer B, and in addition, 20 nm of PEDOT (hole transporting layer) formed between the ITO of the EL layer A and 40 nm of α-NPD (hole transporting layer) is taken as an EL layer C.

Results of comparing electric current densities measured for each voltage applied to each EL layer are shown in FIG. 34. In addition, results of comparing luminosities obtained for each voltage applied to each EL layer are shown in FIG. 35. It is thus understood that the highest electric current density is obtained in the EL layer C which uses the high molecular weight compound PEDOT in the pole injecting layer, and in addition, it can be understood that the superior initial characteristics can also be obtained for luminosity.

By implementing the present invention, an active matrix type EL display device capable of clear, multiple gradation color display and which is not influenced by dispersion in TFT characteristics can be obtained. Specifically, by performing time division gradation display in accordance with a digital signal instead of conventional analog gradation display in the active matrix type EL display device, gradation defects due to dispersion in the characteristics of electric current control TFTs can be eliminated, and a high definition image having good color reproduction can be obtained.

Further, by arranging TFTs having optimal structures unified with the functions required by each circuit or element for the TFTs themselves formed on a substrate, a high reliability active matrix type EL display device is achieved.

By then preparing this type of active matrix type EL display device as a display, it becomes possible to manufacture high performance electronic devices having good image quality and high reliability.

What is claimed is:

1. An electronic apparatus comprising:
   an EL display device having a plurality of pixels,
   wherein each of the pixels comprises:
   a switching TFT having a LDD region in contact with a channel region and not overlapping a gate electrode with a gate insulating film interposed therebetween; and
   a current control TFT having the LDD region overlapping the gate electrode with the gate insulating film interposed therebetween.

2. An electronic apparatus according to claim 1, wherein the EL display device is operated by a time-divisional gradation method.

3. An electronic apparatus according to claim 1, wherein the electronic apparatus is selected from the group consisting of a video camera, a goggle type display device, a navigation system, an audio playback device, a notebook type personal computer, a game apparatus, a portable information terminal and an image playback device.

4. An electronic apparatus comprising:
   an EL display device having a plurality of pixels, a source driver circuit and a gate driver circuit,
   wherein each of the pixels comprises:
   a switching TFT having a LDD region in contact with a channel region and not overlapping a gate electrode with a gate insulating film interposed therebetween; and
   a current control TFT having the LDD region overlapping the gate electrode with the gate insulating film interposed therebetween,
   wherein the switching TFT comprises any one of a p-channel TFT and a n-channel TFT,
   wherein the current control TFT comprises the p-channel TFT, and
   wherein a drain region of the current control TFT is electrically connected to an EL element.

5. An electronic apparatus according to claim 4, wherein the EL display device is operated by a time-divisional gradation method.

6. An electronic apparatus according to claim 4, wherein a time division gradation signal generation circuit is connected to the source driver circuit.

7. An electronic apparatus according to claim 4, wherein the electronic apparatus is selected from the group consisting of a video camera, a goggle type display device, a navigation system, an audio playback device, a notebook type personal computer, a game apparatus, a portable information terminal and an image playback device.

8. An electronic apparatus comprising:
   an EL display device having a plurality of pixels, a source driver circuit and a gate driver circuit,
   wherein each of the pixels comprises:
   a switching TFT having a LDD region in contact with a channel region and not overlapping a gate electrode with a gate insulating film interposed therebetween; and
   a current control TFT having the LDD region overlapping the gate electrode with the gate insulating film interposed therebetween,
   wherein the switching TFT comprises any one of a p-channel TFT and a n-channel TFT,
   wherein the current control TFT comprises the p-channel TFT, and
   wherein a drain region of the current control TFT is electrically connected to a cathode of an EL element.

9. An electronic apparatus according to claim 8, wherein the EL display device is operated by a time-divisional gradation method.

10. An electronic apparatus according to claim 8, wherein a time division gradation signal generation circuit is connected to the source driver circuit.

11. An electronic apparatus according to claim 8, wherein the electronic apparatus is selected from the group consisting of a video camera, a goggle type display device, a navigation system, an audio playback device, a notebook type personal computer, a game apparatus, a portable information terminal and an image playback device.

12. A digital camera comprising:
    a main body;
    an EL display device having a plurality of pixels;
    an eye piece; and
    operating switches,
    wherein each of the pixels comprises:
    a switching TFT having a LDD region in contact with a channel region and not overlapping a gate electrode with a gate insulating film interposed therebetween; and
    a current control TFT having the LDD region overlapping the gate electrode with the gate insulating film interposed therebetween.

13. A digital camera according to claim 12, wherein the EL display device is operated by a time-divisional gradation method.

14. A digital camera comprising:
    a main body;
    an EL display device having a plurality of pixels, a source driver circuit and a gate driver circuit;
    an eye piece; and
    operating switches,
    wherein each of the pixels comprises:
    a switching TFT having a LDD region in contact with a channel region and not overlapping a gate electrode with a gate insulating film interposed therebetween; and
    a current control TFT having the LDD region overlapping the gate electrode with the gate insulating film interposed therebetween,
    wherein the switching TFT comprises any one of a p-channel TFT and a n-channel TFT,
    wherein the current control TFT comprises the p-channel TFT, and
    wherein a drain region of the current control TFT is electrically connected to an EL element.

15. A digital camera according to claim 14, wherein the EL display device is operated by a time-divisional gradation method.

16. A digital camera according to claim 14, wherein a time division gradation signal generation circuit is connected to the source driver circuit.

17. A digital camera comprising:
    a main body;
    an EL display device having a plurality of pixels, a source driver circuit and a gate driver circuit;
    an eye piece; and
    operating switches, wherein each of the pixels comprises:

a switching TFT having a LDD region in contact with a channel region and not overlapping a gate electrode with a gate insulating film interposed therebetween; and a current control TFT having the LDD region overlapping the gate electrode with the gate insulating film interposed therebetween, wherein the switching TFT comprises any one of a p-channel TFT and a n-channel TFT, wherein the current control TFT comprises the p-channel TFT, and wherein a drain region of the current control TFT is electrically connected to a cathode of an EL element.

18. A digital camera according to claim 17, wherein the EL display device is operated by a time-divisional gradation method.

19. A digital camera according to claim 17, wherein a time division gradation signal generation circuit is connected to the source driver circuit.

* * * * *